United States Patent
Tanaka et al.

(10) Patent No.: US 7,276,744 B2
(45) Date of Patent: Oct. 2, 2007

(54) SEMICONDUCTOR DEVICE AND METHOD OF MANUFACTURING THE SAME

(75) Inventors: Kenichi Tanaka, Kodaira (JP);
Tomonori Tanoue, Machida (JP);
Hidetoshi Matsumoto, Kokubunji (JP);
Hiroshi Ohta, Kawasaki (JP);
Kazuhiro Mochizuki, Tokyo (JP);
Hiroyuki Uchiyama, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 85 days.

(21) Appl. No.: 11/316,908

(22) Filed: Dec. 27, 2005

(65) Prior Publication Data

US 2006/0138458 A1    Jun. 29, 2006

(30) Foreign Application Priority Data

Dec. 28, 2004   (JP)   ............................. 2004-380502

(51) Int. Cl.
*H01L 29/33* (2006.01)
*H01L 31/109* (2006.01)
(52) U.S. Cl. ...................... 257/197; 257/552; 257/553; 257/556; 257/557; 257/560; 438/235; 438/236
(58) Field of Classification Search ................ 257/197, 257/552–562; 438/235–238
See application file for complete search history.

(56) References Cited

U.S. PATENT DOCUMENTS

| 4,746,626 A * | 5/1988 | Eda et al. .................... 438/315 |
| 6,455,364 B1 * | 9/2002 | Asai et al. .................. 438/235 |
| 6,593,604 B2 * | 7/2003 | Ishimaru ..................... 257/197 |

OTHER PUBLICATIONS

N. Matine et al., "Novel Approach for InP-Based Ultrafast HBTs," *IPRM: Proceedings of Eighth International Conference on Indium Phosphide and Related Materials*, 1996, pp. 137-140.

* cited by examiner

*Primary Examiner*—Wai-Sing Louie
*Assistant Examiner*—Marc-Anthony Armand
(74) *Attorney, Agent, or Firm*—Miles & Stockbridge PC

(57) ABSTRACT

This invention is intended to provide an HBT capable of achieving, if the HBT is a collector-up HBT, the constriction of the emitter layer disposed directly under an external base layer, and reduction in base-emitter junction capacity, or if the HBT is an emitter-up HBT, reduction in base-collector junction capacity. For the collector-up HBT, window structures around the sidewalls of a collector are used to etch either the emitter layer disposed directly under the external base layer, or an emitter contact layer For the emitter-up HBT, window structures around the sidewalls of an emitter are used to etch either the collector layer disposed directly under the external base layer, or a collector contact layer. In both HBTs, the external base layer is supported by a columnar structure to ensure mechanical strength.

12 Claims, 32 Drawing Sheets

SEMICONDUCTOR DEVICE AND METHOD OF MANUFACTURING THE SAME

CLAIM OF PRIORITY

The present application claims priority from Japanese application JP 2004-380502 filed on Dec. 28, 2004, the content of which is hereby incorporated by reference into this application.

BACKGROUND OF THE INVENTION

The present invention relates to a semiconductor device with a heterojunction bipolar transistor which uses a compound semiconductor, and to a method of manufacturing the semiconductor device.

Reduction in the emitter-base junction capacities and base-collector junction capacities of heterojunction bipolar transistors is closely associated with improvement of device performance characteristics such as an operating speed. In particular, collector-up heterojunction bipolar transistors (hereinafter, abbreviated to C-up HBTs), compared with emitter-up heterojunction bipolar transistors (hereinafter, abbreviated to E-up HBTs), have the advantages that the former can be reduced in parasitic collector capacity and enhanced in maximum oscillation frequency. However, C-up HBTs have had the problem that since an emitter-base junction area increases above a base-collector junction area, part of the electrons that have been injected from the emitter fail to reach the collector and thus that this event reduces a grounded-emitter current amplification factor (hereinafter, abbreviated to the current amplification factor). In order to prevent this problem, there is a technique for preparing an electric-current constriction structure by stacking an emitter layer, a base layer, and a collector layer, in that order, on a crystal-growing substrate and then side-etching the emitter layer. This technique is proposed by way of example in, for instance, the "Proceedings of Eighth International Conference on Indium Phosphide and Related Materials (1996), pp. 137-140".

SUMMARY OF THE INVENTION

A typical example of a current constriction structure in collector-up HBTs is seen in an example of stacking an emitter layer, a base layer, and a collector layer, in that order, on the above-mentioned crystal-growing substrate and then side-etching the emitter layer (etching the emitter layer from the side). In a more specific example, the emitter layer is processed for a physically small opposed area with respect to the collector layer. In this example, side-etching of the emitter layer in the stacked structure formed up of the base substance, the emitter layer, the base layer, and the collector layer, not only increases the amount of etching from the side of the emitter layer, but also yields the insufficiency in controllability. Therefore, the amount of side-etching significantly varies, which naturally causes variations in HBT characteristics.

Also, in the stacked structure described above, the width of the side-etched emitter layer is, of course, reduced below that of the base layer formed on the emitter layer. Accordingly, since a hollow region is formed directly under an external base layer, there has been the disadvantage of insufficient mechanical strength.

An emitter layer or an emitter contact layer is etched or side-etched from a window section adjacent to a collector layer sidewall to form an external base layer with an emitter-base junction area smaller than a base-collector junction area.

An external base layer that is positioned between window sections adjacent to a collector layer sidewall is side-etched from both window sections to make the external base layer hollow.

An emitter contact layer is formed to ensure that the area of its face congruent to an emitter layer is smaller than a base-collector area, that the area of its face opposite to the emitter layer is greater than the area of the congruent face, and that the film thickness of the emitter layer is 15 nm or more, but up to 50 nm.

The present invention allows a similar technological philosophy to be applied to a stacked semiconductor assembly, even in an emitter-up HBT. The collector layer in the E-up HBT is etched from the window section of an external base layer to reduce a base-collector junction capacity.

The present invention is characterized in that a base-emitter junction area smaller than a collector-base junction area can be formed by conducting a very small amount of side-etching without implanting an ion in a section adjacent to an intrinsic transistor section.

A specific example of a practical basic mode of carrying out the present invention is shown below. That is to say, this basic mode of embodiment is a semiconductor device with a heterojunction bipolar transistor, including a semiconductor substrate, five conductive types semiconductor layers, and three electrodes. A first conductive type first semiconductor layer is formed on the above semiconductor substrate, a first conductive type second semiconductor layer of a desired shape is formed on the above first conductive type first semiconductor layer. A second conductive type third semiconductor layer is formed on the above first conductive type second semiconductor layer, has a forbidden bandgap smaller than that of the first conductive type second semiconductor layer, and forms a base region. A first conductive type fourth semiconductor layer is formed on the above second conductive type third semiconductor layer and has a forbidden bandgap larger than that of the second conductive type third semiconductor layer. A first conductive type fifth semiconductor layer is formed on the above first conductive type fourth semiconductor layer. A first electrode is connected to the first conductive type first semiconductor layer, a second electrode to the second conductive type third semiconductor layer, and a third electrode to the first conductive type fifth semiconductor layer.

In the semiconductor device outlined above, a peripheral section of the first conductive type fourth semiconductor layer has multiple removal portions for the second conductive type third semiconductor layer, in this second conductive type third semiconductor layer. In addition, the section of the stacked semiconductor assembly, associated with the above removal portions for the second conductive type third semiconductor layer, does not have the second conductive type third semiconductor layer or either the first conductive type second semiconductor layer or the first conductive type first semiconductor layer or neither of the latter two semiconductor layers.

Of the multiple removal portions for the second conductive type third semiconductor layer, first and second removal portions thereof are adjacent to each other, and between the first and second removal portions, the second conductive type third semiconductor layer exists, and the first conductive type fourth semiconductor layer or the first conductive type fifth semiconductor layer does not exist or neither of the latter two semiconductor layers exists.

Furthermore, in the region of the second conductive type third semiconductor layer that is positioned outside the removal portions for the second conductive type third semiconductor layer, the second conductive type third semiconductor layer, the first conductive type second semiconductor layer, and the first conductive type first semiconductor layer exist in order for the above-mentioned region to have a columnar structure.

If the above heterojunction bipolar transistor is of a collector-up structure, the first semiconductor layer is constructed as an emitter contact layer, the second semiconductor layer as an emitter layer, the third semiconductor layer as a base layer, the four semiconductor layer as a collector layer, and the fifth semiconductor layer as a collector contact layer. In this case, an emitter-base junction area is smaller than a collector-base junction area. If the above heterojunction bipolar transistor is of an emitter-up structure, the first semiconductor layer is constructed as a collector contact layer, the second semiconductor layer as a collector layer, the third semiconductor layer as a base layer, the four semiconductor layer as an emitter layer, and the fifth semiconductor layer as an emitter contact layer. In this case, the collector-base junction area is larger than the emitter-base junction area.

The transistor in the present invention is very suitable for constructing a power amplifier. It is free to construct a power amplifier using multiple such transistors.

According to the present invention, it is possible to fabricate a semiconductor device having a C-up HBT small in base-collector junction capacity and high in maximum oscillation frequency.

According to the present invention, it is possible to fabricate a semiconductor device having a C-up HBT whose mechanical strength is ensured.

According to the present invention, it is possible to fabricate a semiconductor device having a C-up HBT free of area dependence on current gain.

According to the present invention, it is possible to fabricate a semiconductor device having a C-up HBT small in base-collector junction capacity.

DETAILED DESCRIPTION OF THE PREFERRED EMBODIMENTS

Figure 1:
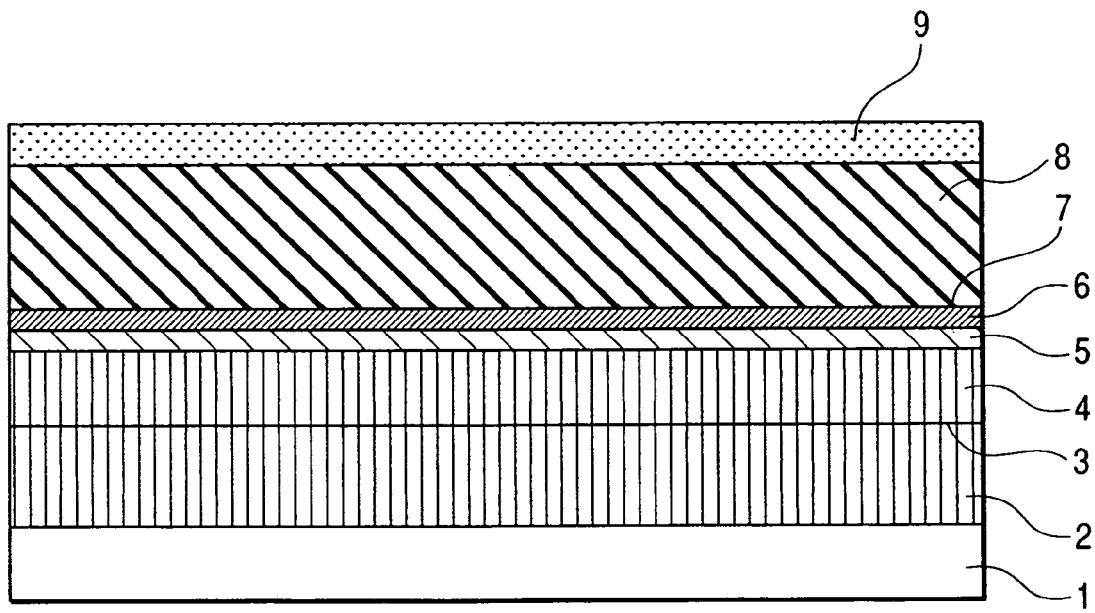
FIG. 1 is a sectional device view showing a collector-up HBT of a first embodiment in order of manufacturing process steps.

A C-up HBT with a base-emitter junction area smaller than a base-collector junction area can be achieved with a smaller amount of window etching than conventional 2 μm or more of side-etching. For this reason, the C-up HBT can be enhanced in the current amplification factor and reduced in base-emitter junction capacity. The windows in that case can be of any shape, only if etching is possible. A width between the windows, however, must be such that an emitter contact layer therebetween is made hollow by side-etching from both windows.

An emitter contact layer whose area is small at the emitter layer side and large at an opposite side can be realized by, for example, side-etching an emitter contact layer epitaxially grown on a substrate made of a zinc-blende crystalline-structured compound semiconductor of plane orientation (100), by use of such an etchant that provides a longitudinal side face(s) of a forward mesa shape to an emitter layer whose planar shape is rectangular.

At that time, plane {111} is generated on the side face(s) of the emitter contact layer by side-etching. In compound semiconductors with a zinc-blende crystalline structure, however, plane {111} is the face smallest in etching rate. Even if the emitter contact layer is over-etched during its side-etching, therefore, variations in a contact area between the emitter contact layer and the emitter layer can be reduced to a negligible level.

Additionally, unlike conventional technology, a technique according to the present invention does not reduce an area of the emitter layer. Instead, the technique according to the present invention reduces an area of the emitter contact layer to thereby thin down the emitter layer to a film thickness of 50 nm or less. A transverse spread of the electrons that have been injected from the emitter contact layer into the emitter layer can thus be essentially ignored. Variations in the emitter area determined by the contact area between the emitter layer and the base layer can be consequently reduced to a negligible level. Variations in the emitter area can be further reduced if side-etching that uses the above-mentioned {111} plane from the window section is used in conjunction with the etching process described above. Furthermore, since the emitter contact layer is of a high impurity concentration compared with that of the emitter layer, depletion imposes substantially no restrictions on device microstructuring.

Besides, a minimum permissible emitter layer film thickness value of 15 nm satisfies the condition that a grounded emitter current amplification factor be at least 30.

When GaAs is used to form the emitter contact layer by side-etching thereof, wet etching is preferable that enables a selection ratio of at least 10 with respect to InGaP whose InGa molar ratio is 0.5. For example, a 5° C. liquid mixture of citric acid, hydrogen peroxide, and water, is suitable in that case. An etchant to be used for side-etching formation can be a combination of substances such as phosphoric acid, hydrogen peroxide, and water.

For an E-up HBT, the base-collector junction capacity can be reduced by etching a collector layer from a window section of an external base layer.

First Embodiment

Figure 7A:
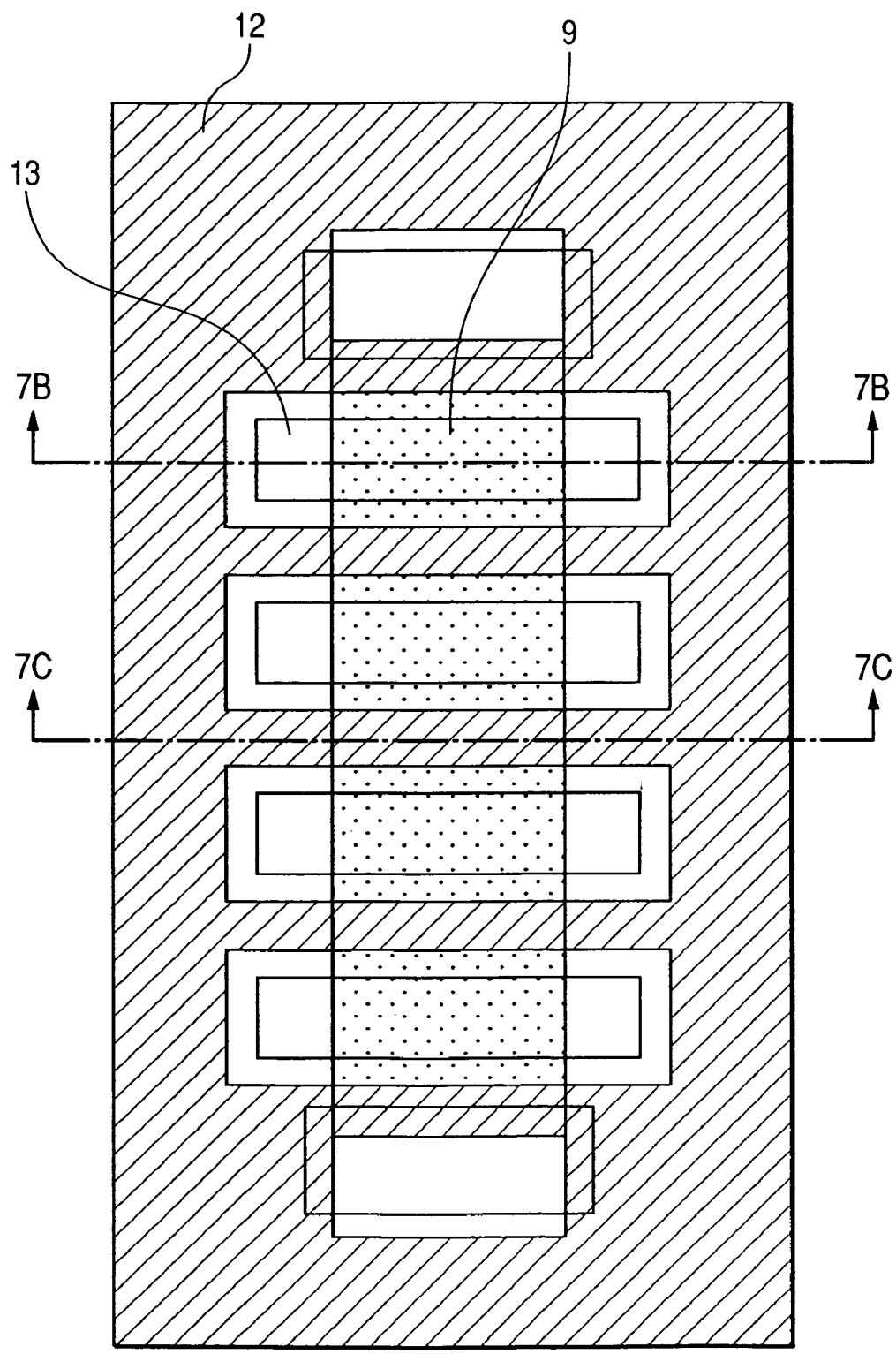
FIG. 7A is a further top layout view of the masks used during the manufacturing process for the collector-up HBT of the first embodiment.
Figure 7B:
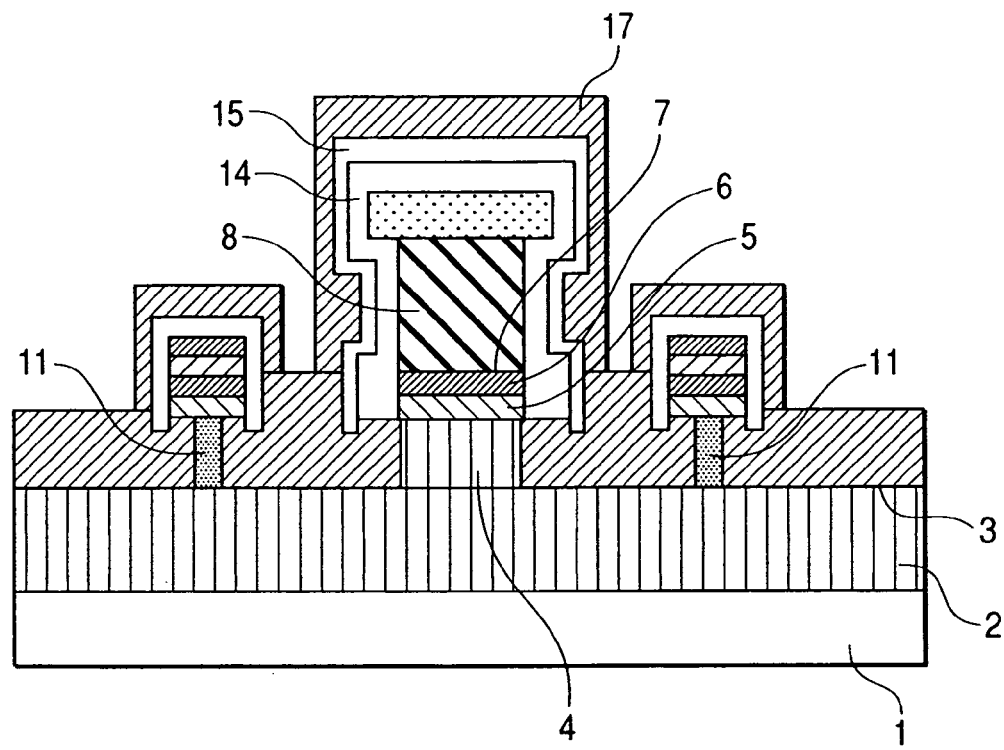
FIG. 7B is a sectional view of the collector-up HBT of the first embodiment, taken along lines 7B-7B in FIG. 7A.
Figure 7C:
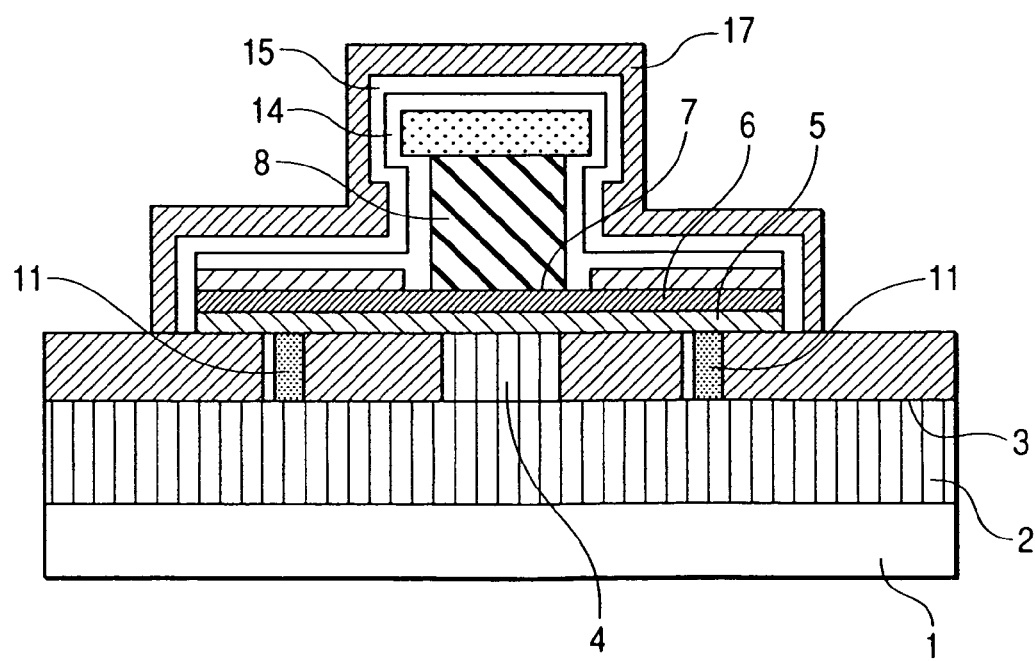
FIG. 7C is a sectional view of the collector-up HBT of the first embodiment, taken along lines 7C-7C in FIG. 7A.
Figure 8A:
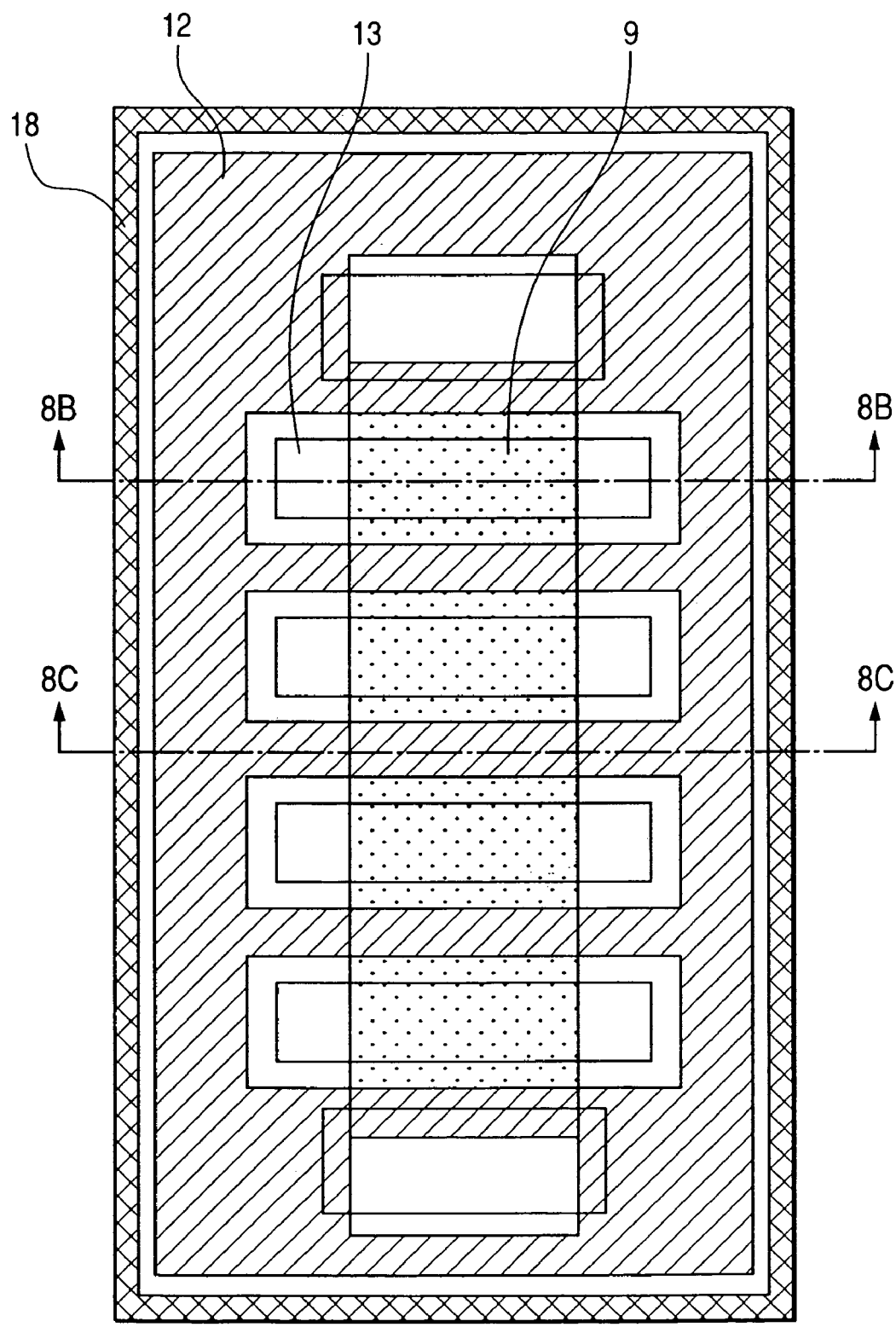
FIG. 8A is a further top layout view of the masks used during the manufacturing process for the collector-up HBT of the first embodiment.
Figure 8B:
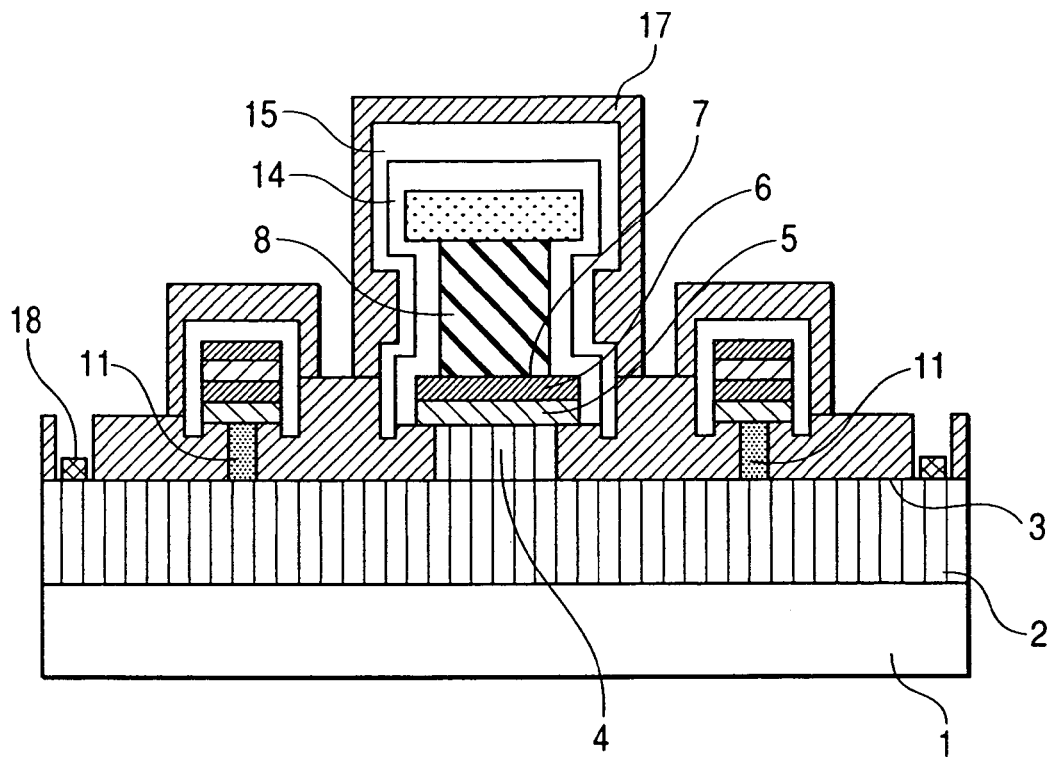
FIG. 8B is a sectional view of the collector-up HBT of the first embodiment, taken along lines 8B-8B in FIG. 8A.
Figure 8C:
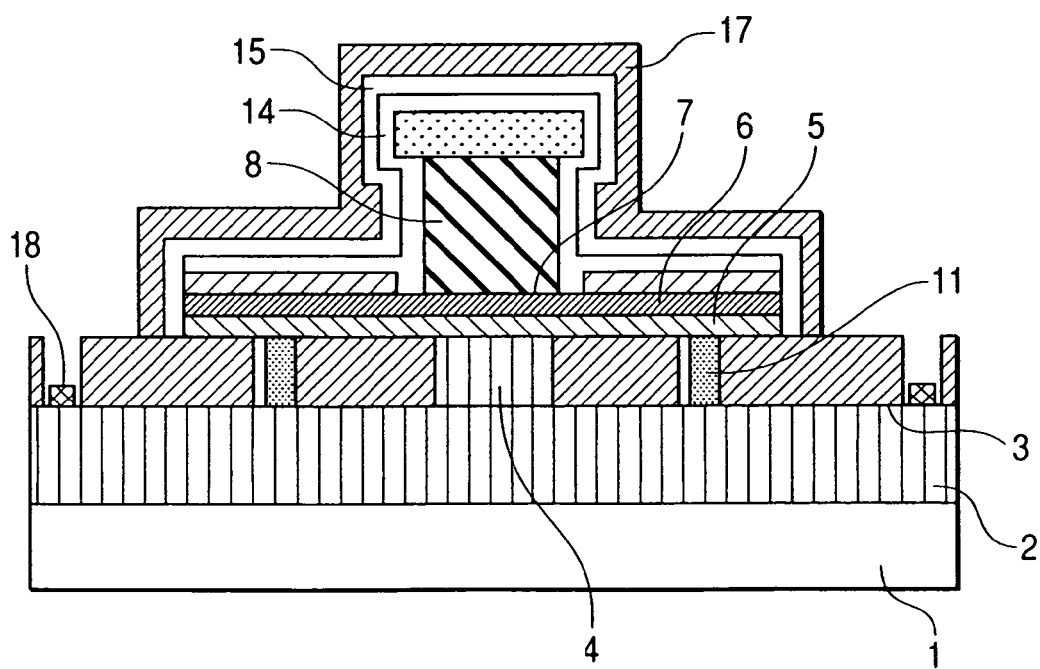
FIG. 8C is a sectional view of the collector-up HBT of the first embodiment, taken along lines 8C-8C in FIG. 8A.
Figure 9:
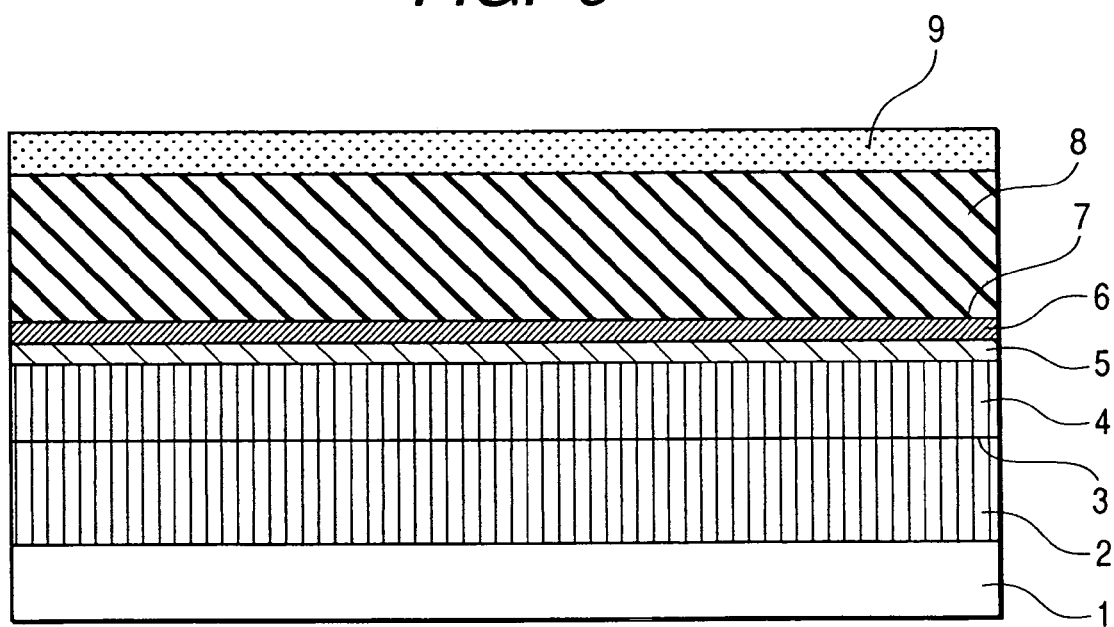
FIG. 9 is a sectional device view showing a collector-up HBT of a second embodiment in order of manufacturing process steps.

An npn-type C-up HBT, a first embodiment of the present invention, will be described using FIGS. 1 to 8C. In the present embodiment, as illustrated in longitudinal structural views of FIGS. 8B and 8C, a second emitter contact layer 4 is opened by etching from a window structure and by side-etching, and an effective emitter area of 0.5×0.5 μm$^2$ (a contact area between the second emitter contact layer 4 and an emitter layer 5) is smaller than a base-collector area of 0.7×0.7 μm$^2$ (a contact area between a base layer 6 and a collector layer 8). FIG. 8A is a top view of the C-up HBT, and FIGS. 8B, 8C are sectional views of an associated device, taken along lines 8B-8B, 8C-8C, respectively, in FIG. 8A.

A manufacturing process for the C-up HBT will be described below using FIGS. 1 to 8C.

First, seven layers are formed on a semi-dielectric GaAs (100) substrate 1. That is to say, a first emitter contact layer 2, an etching stop layer 3, a second emitter contact layer 4, an n-type InGaP emitter layer 5, a base layer 6, an etching stop layer 7, and a collector layer 8, are sequentially deposited using metal-organic vapor phase epitaxy. The first emitter contact layer 2 made of highly doped n-type GaAs has a $5 \times 10^{18} cm^{-3}$ silicon (Si) concentration and a 0.5 µm film thickness. The etching stop layer 3 made of highly doped n-type InGaP has a 0.5 InP molar ratio, a $5 \times 10^{17} cm^{-3}$ Si concentration, and a 0.1 µm film thickness. The second emitter contact layer 4 made of highly doped n-type GaAs has a $5 \times 10^{18} cm^{-3}$ Si concentration and a 0.05 µm film thickness. The n-type InGaP emitter layer 5 has a 0.5 InP molar ratio, a $3 \times 10^{17} cm^{-3}$ Si concentration, and a 0.05 µm film thickness. The base layer 6 made of highly doped p-type GaAs has a $5 \times 10^{19} cm^{-3}$ carbon (C) concentration and a 0.05 µm film thickness. The etching stop layer 7 made of highly doped n-type InGaP has a 0.5 InP molar ratio, a $5 \times 10^{17} cm^{-3}$ Si concentration, and a 0.05 µm film thickness. The collector layer 8 made of n-type InGaAs has an InAs molar ratio that changes from 0.0 to 0.5, an Si concentration that changes from $3 \times 10^{16} cm^{-3}$ to $2 \times 10^{19} cm^{-3}$, and a 0.8 µm film thickness. In this collector-up HBT, the n-type InGaP-made etching stop layer 7, although effective for suppressing hole injection from a base into a collector and reducing an offset voltage, is not always an absolutely necessary layer for the collector-up HBT to operate. The deposition of the above seven layers is followed by depositing a WSi layer 9 (WSi: 0.3 in Si molar ratio, 0.5 µm in film thickness) on entire wafer surface using a high-frequency sputtering method (see FIGS. 1 and 2A).

Figure 2A:
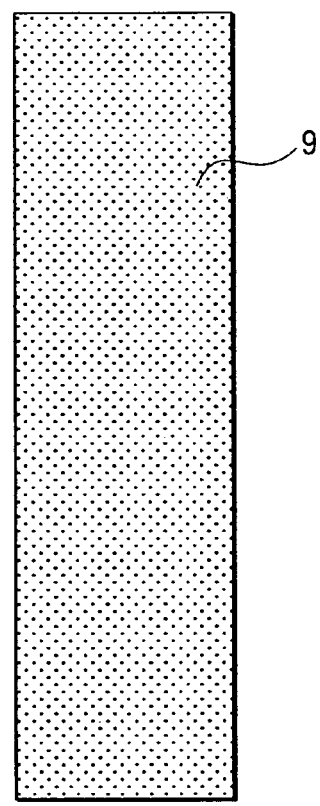
FIG. 2A is a top view of one of the masks used during the manufacturing process for the collector-up HBT of a first embodiment.
Figure 2B:
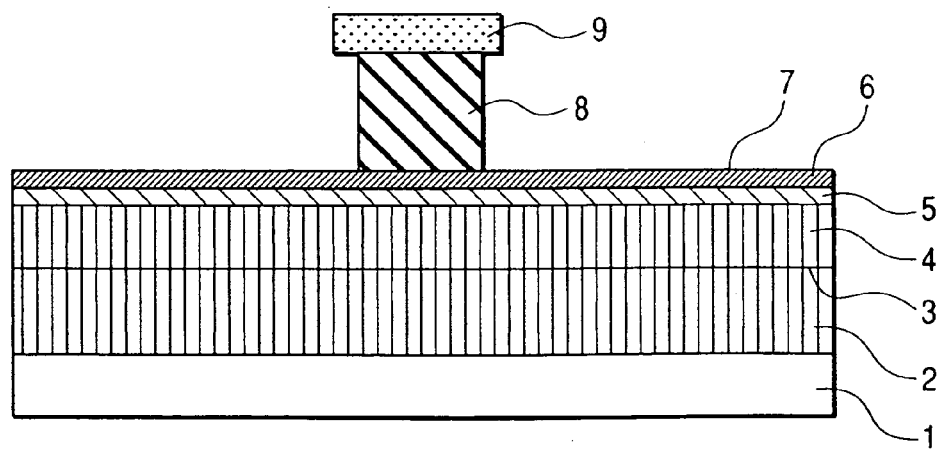
FIG. 2B is another sectional device view showing the collector-up HBT of the first embodiment in order of the manufacturing process steps.

After that, dry etching with photolithography and $CF_4$ is used to process the WSi layer into a desired shape and thus form a collector electrode 9 (FIG. 2B). Next, dry etching with $SF_6$ and $SiCl_4$ and wet etching with a liquid mixture of phosphoric acid, hydrogen peroxide, and water, are used in combination to remove a part of the n-type InGaAs collector layer 8 with the collector electrode 9 utilized as a masking region, and form the collector layer 8 into a desired shape (FIG. 2B). FIG. 2A shows a top view of the mask for etching the collector layer, and FIG. 2B shows a longitudinal sectional view of the device formed in this process phase.

Figure 3A:
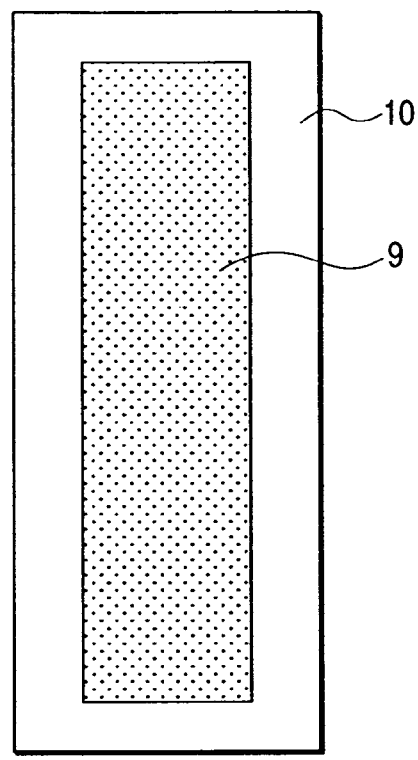
FIG. 3A is a top layout view of the masks used during the manufacturing process for the collector-up HBT of the first embodiment.
Figure 3B:
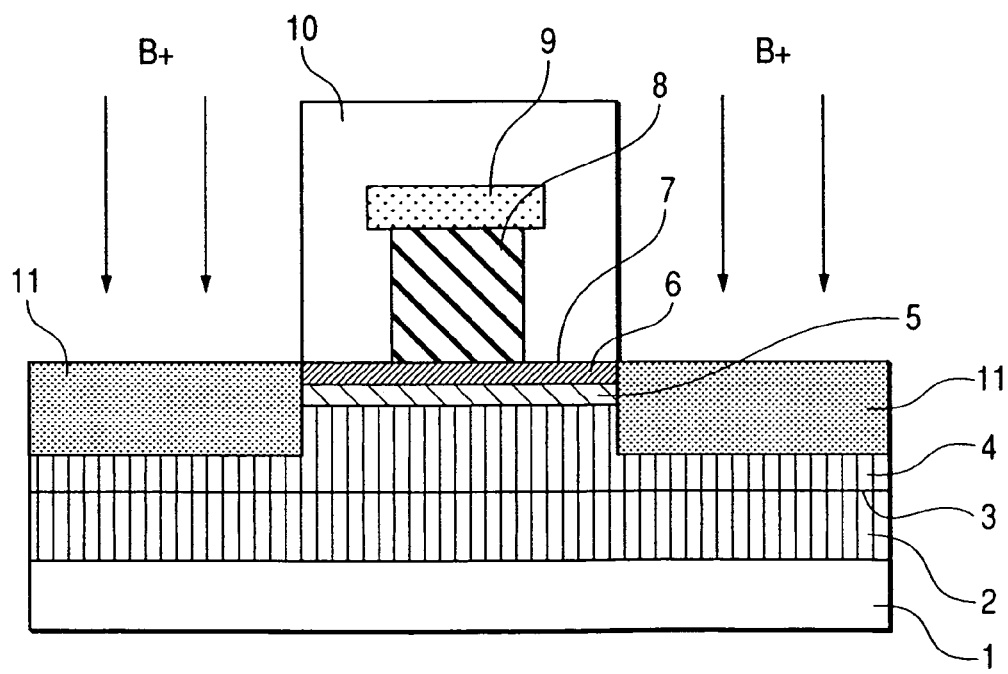
FIG. 3B is still another sectional device view showing the collector-up HBT of the first embodiment in order of the manufacturing process steps.

The above is followed by depositing a 0.6-µm-thick $SiO_2$ film 10 using a plasma-excited chemical vapor deposition method. Next, this $SiO_2$ film is processed into a desired shape by conducting an anisotropic etching operation with photolithography and a plasma mixture of $C_2F_6$ and $CHF_3$. After this, with the $SiO_2$ film 10 as a masking region, boron ions are implanted at room temperature under the conditions of 50 keV in acceleration energy and $2 \times 10^{14} cm^{-2}$ in dose rate to thereby form a high-resistance GaAs region 11 in an emitter contact layer formed under an external base region. The high-resistance GaAs region 11 suppresses a portion of a base current which flows into a parasitic emitter-base junction. The high-resistance GaAs region 11 can likewise be formed by implanting either hydrogen, helium, beryllium, carbon, nitrogen, oxygen, fluorine, or neon ions, instead of the above-mentioned boron ions. FIG. 3A shows a mask top view and the $SiO_2$ film, and FIG. 3B shows a longitudinal sectional view of the device formed in this process phase.

Figure 4A:
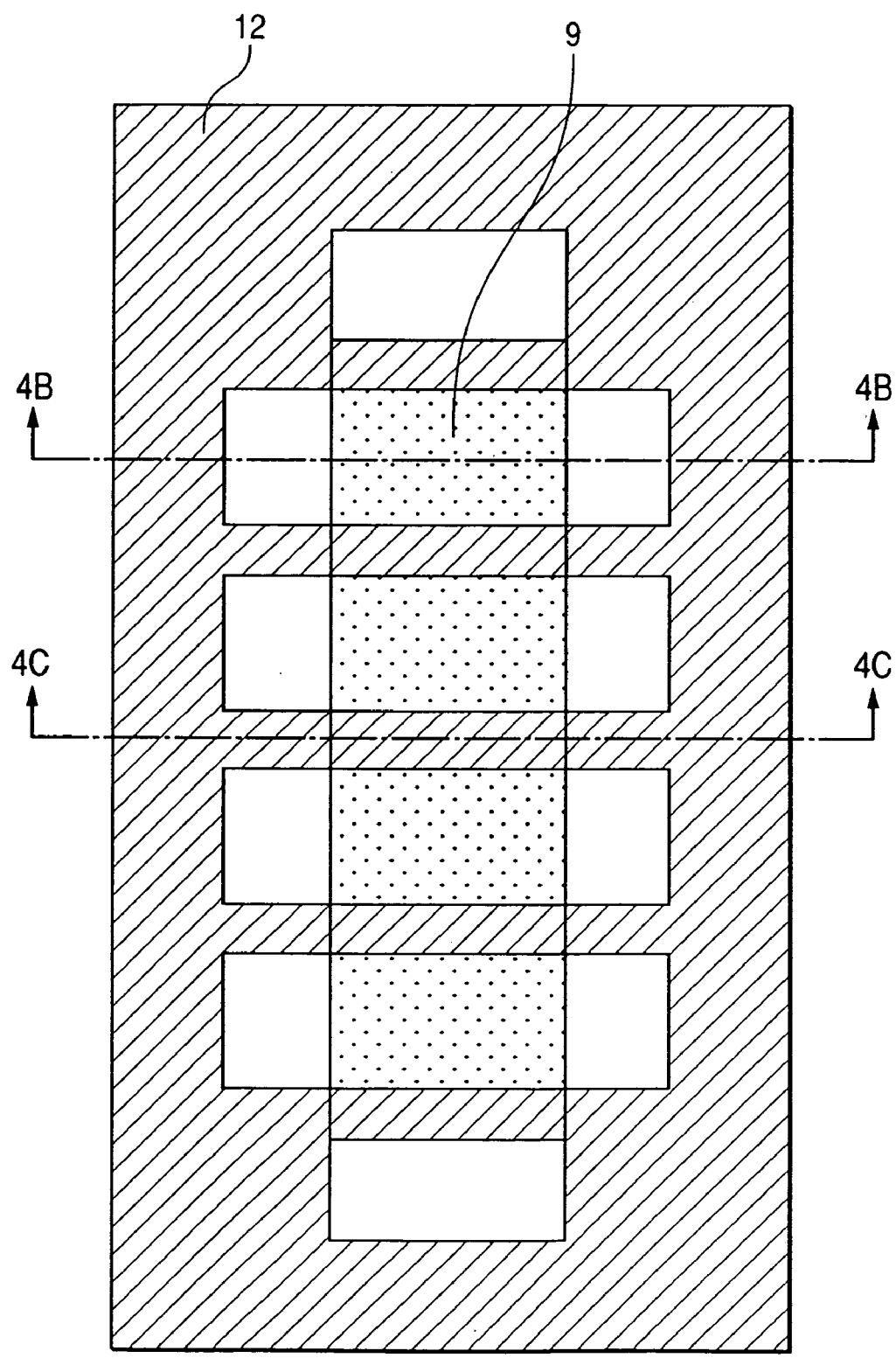
FIG. 4A is another top layout view of the masks used during the manufacturing process for the collector-up HBT of the first embodiment.
Figure 4B:
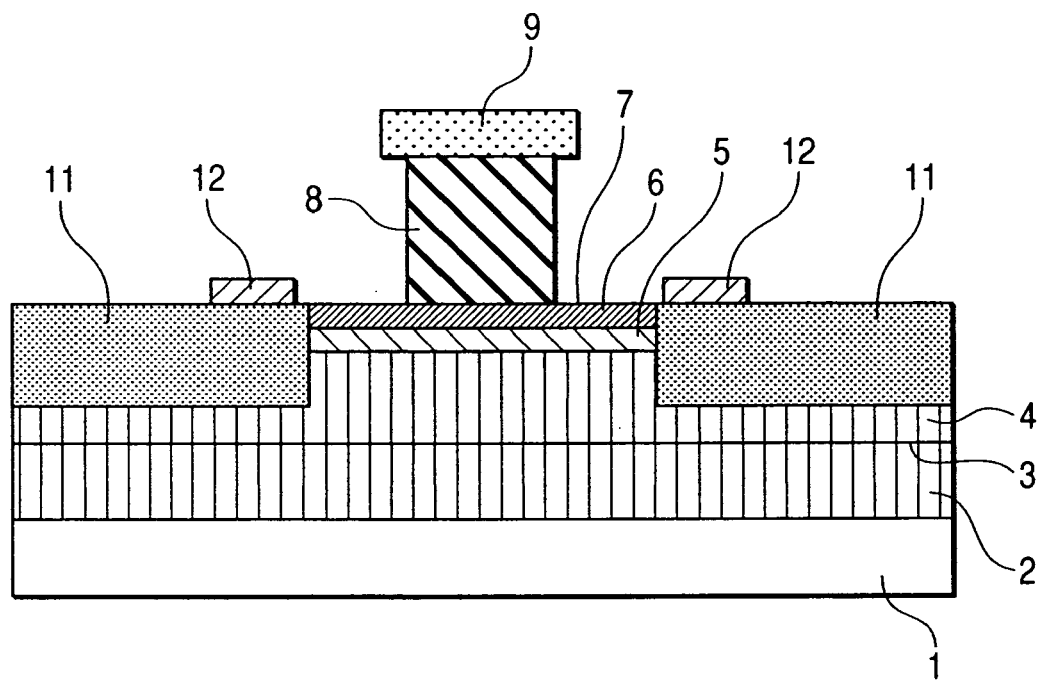
FIG. 4B is a sectional view of the collector-up HBT of the first embodiment, taken along lines 4B-4B in FIG. 4A.
Figure 4C:
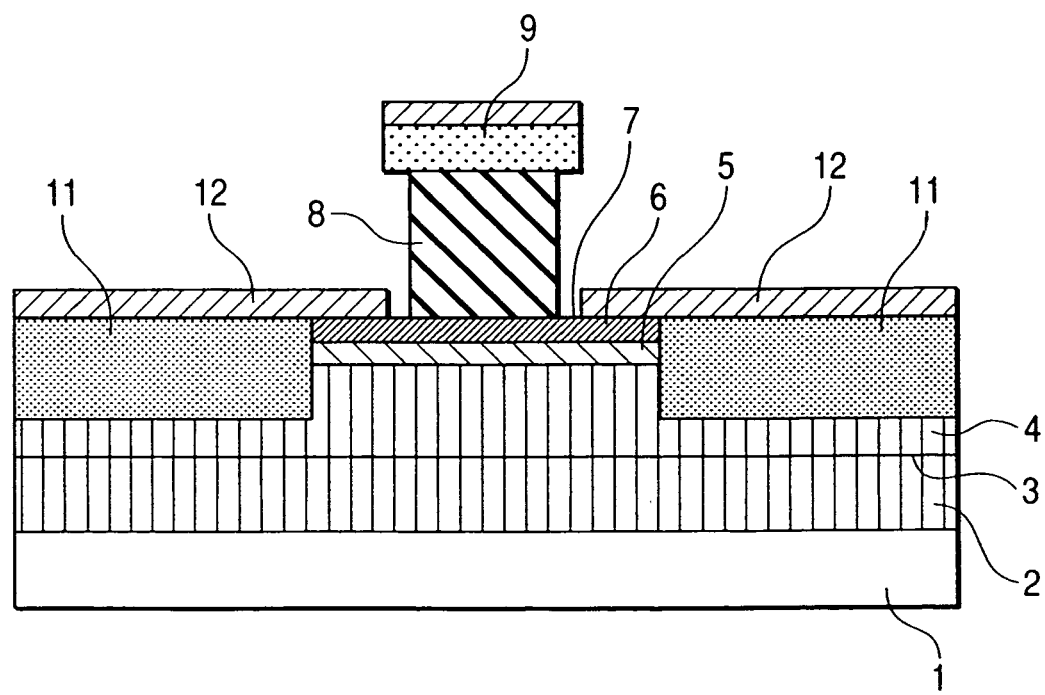
FIG. 4C is a sectional view of the collector-up HBT of the first embodiment, taken along lines 4C-4C in FIG. 4A.

After that, the $SiO_2$ film 10 is removed by wet etching, and in order that multiple window sections 13 exist along collector layer periphery, a base electrode 12 that is a stacked structure formed up of a 20-nm-thick platinum (Pt) film, a 50-nm-thick titanium (Ti) film, a 50-nm-thick platinum (Pt) film, and a 200-nm-thick gold (Au) film, is formed in a self-aligned fashion, although only for a partial region between the window sections, by using an electron beam evaporation method and a lift-off method. FIG. 4A shows a top view of the major sections formed in this process step, and FIG. 4B shows a longitudinal sectional view of the major sections along lines 4B-4B and 4C-4C in FIG. 4A.

Figure 5A:
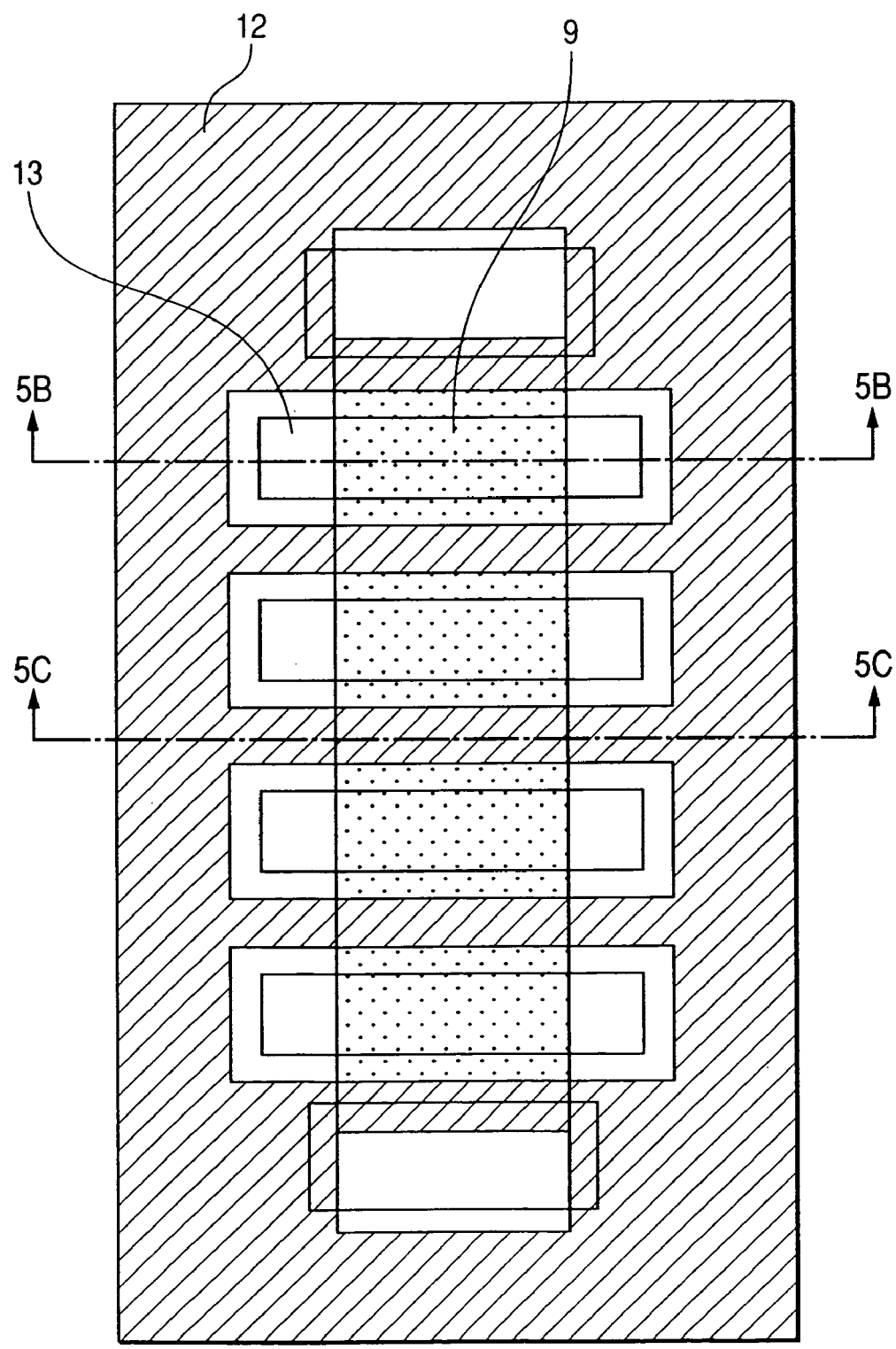
FIG. 5A is yet another top layout view of the masks used during the manufacturing process for the collector-up HBT of the first embodiment.
Figure 5B:
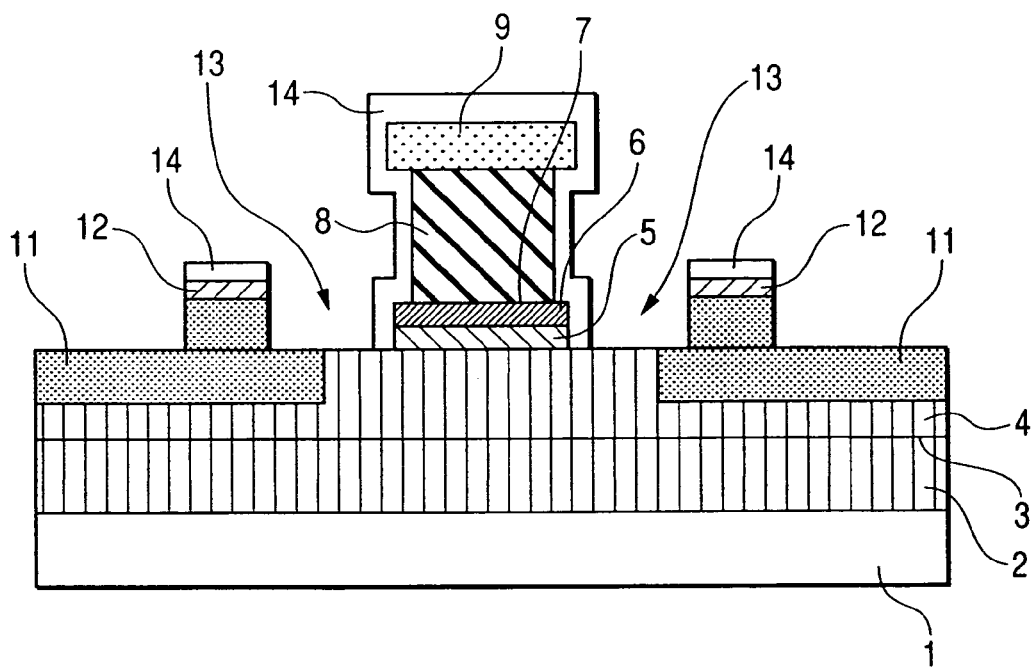
FIG. 5B is a sectional view of the collector-up HBT of the first embodiment, taken along lines 5B-5B in FIG. 5A.
Figure 5C:
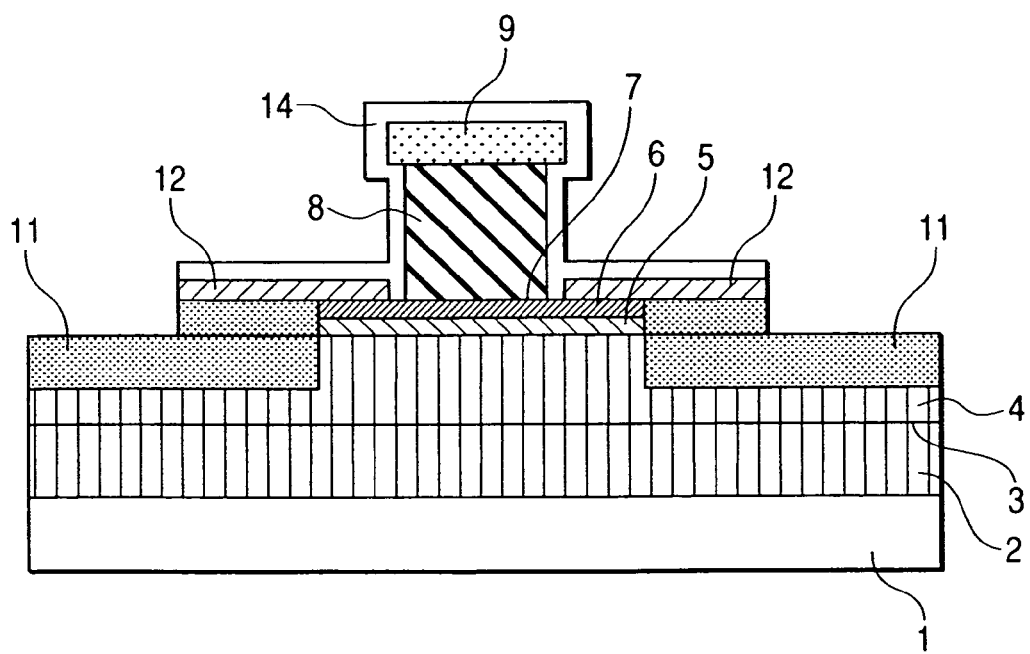
FIG. 5C is a sectional view of the collector-up HBT of the first embodiment, taken along lines 5C-5C in FIG. 5A.

After that, a 0.1-µm-thick $SiO_2$ film 14 is deposited using a plasma-excited chemical vapor deposition method. Next, inside the $SiO_2$ film 14, dry etching with photolithography and $CF_4$ is conducted to vertically process portions of each of the InGaP-made etching stop layer 7, the GaAs-made base layer 6, the InGaP-made emitter layer 5, and the GaAs-made second emitter contact layer 4, to thereby form openings in the window sections. Also, outside the base electrode, the emitter contact layer 4 is exposed. FIG. 5A shows a top view of the major sections formed in this process step, and FIG. 5B is a longitudinal sectional view showing the major sections when these sections are viewed from top, along lines 5B-5B and 5C-5C in FIG. 5A.

Figure 6A:
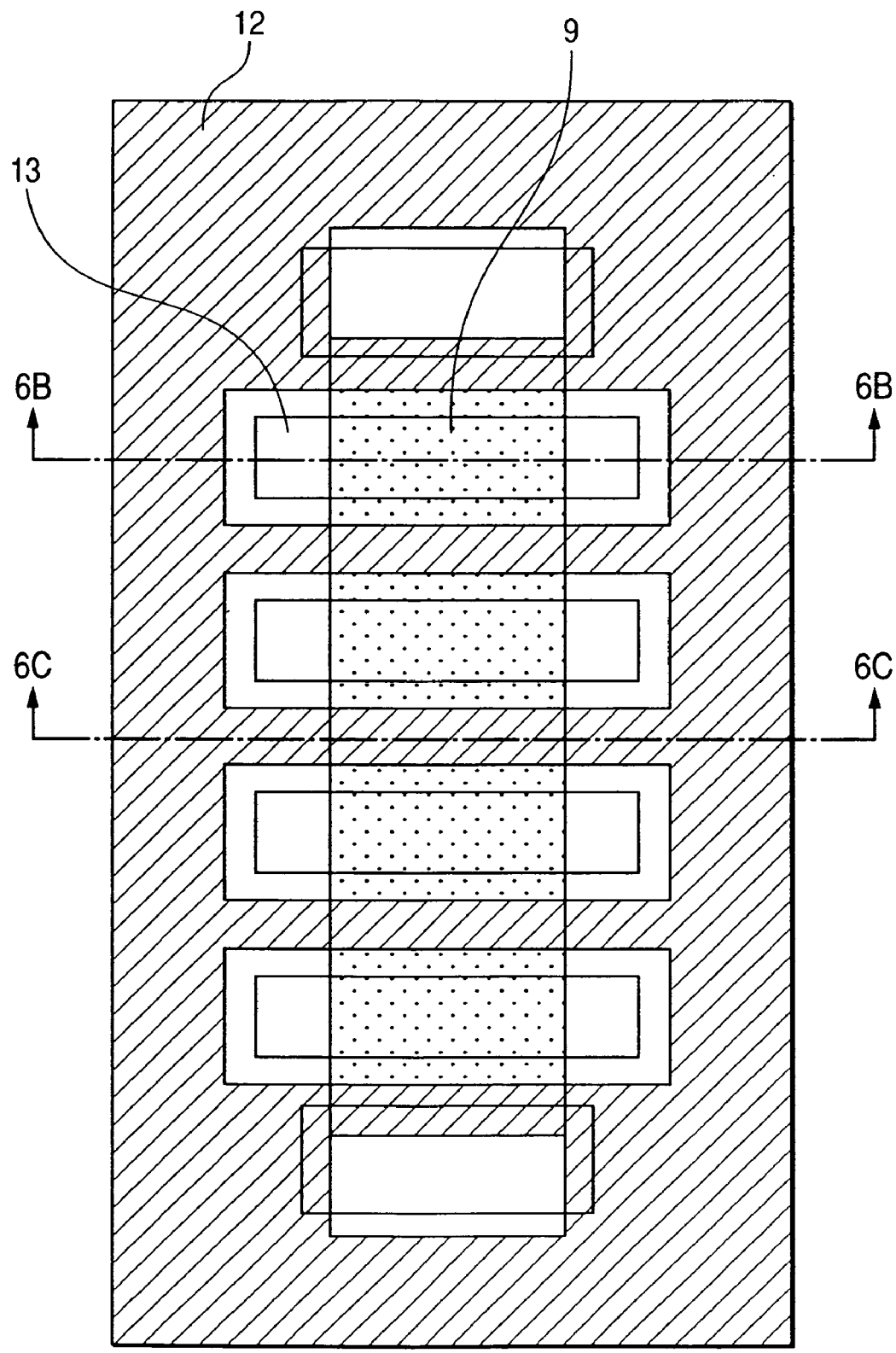
FIG. 6A is a further top layout view of the masks used during the manufacturing process for the collector-up HBT of the first embodiment.

Next, a 0.1-µm-thick $SiO_2$ film 15 is deposited using a plasma-excited chemical vapor deposition method. After that, anisotropic etching with photolithography and a plasma mixture of $C_2F_6$ and $CHF_3$ is conducted on $SiO_2$ film 15 to form an $SiO_2$ sidewall 16. Next, the second emitter contact layer made of highly doped n-type GaAs is side-etched by wet etching with a 5° C. liquid mixture of citric acid, hydrogen peroxide, and water, to thereby form a sidewall 16. FIG. 6A shows a top view of the major sections formed in this process step, and FIG. 6B is a longitudinal sectional view showing the major sections when these sections are viewed from top, along lines 6B-6B and 6C-6C in FIG. 6A.

Figure 6B:
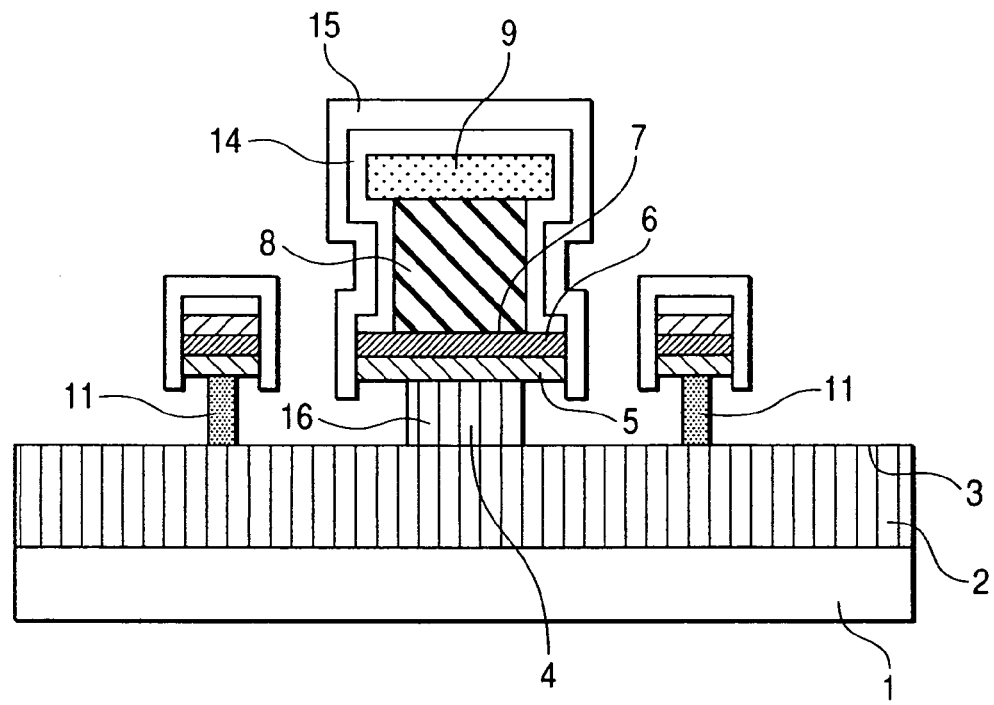
FIG. 6B is a sectional view of the collector-up HBT of the first embodiment, taken along lines 6B-6B in FIG. 6A.
Figure 6C:
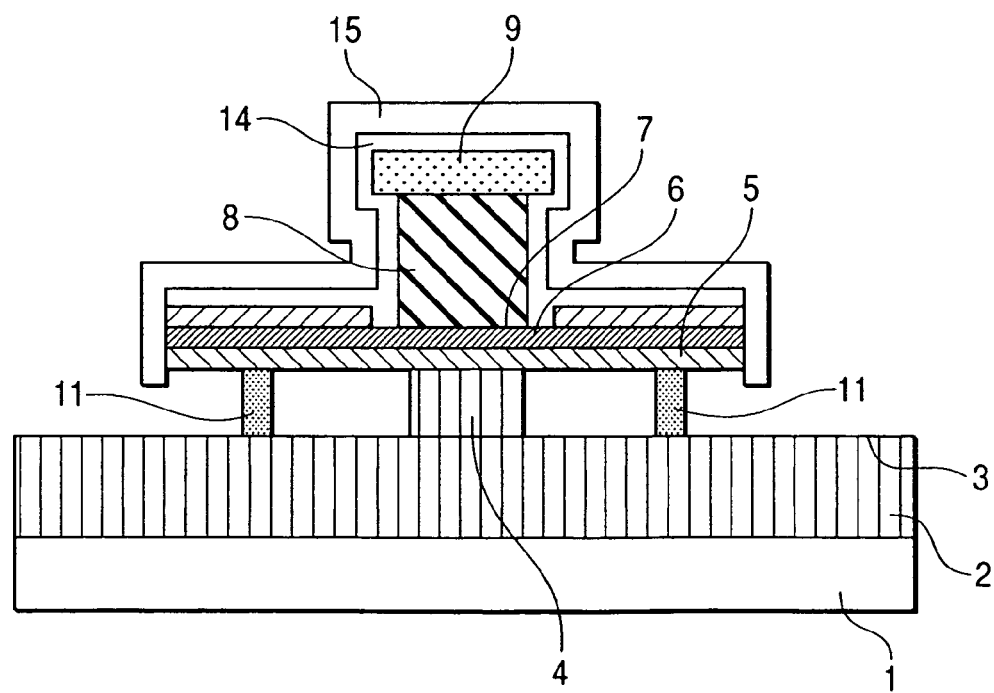
FIG. 6C is a sectional view of the collector-up HBT of the first embodiment, taken along lines 6C-6C in FIG. 6A.

At this time, the GaAs emitter contact layer 4 positioned between the openings of the window sections, directly under the GaAs base layer 6 and InGaP emitter layer 5, is wet-etched with a 5° C. liquid mixture of citric acid, hydrogen peroxide, and water, so as to become hollow (see FIG. 6C). The etchant used for the side-etching formation denoted by reference number 16 in FIG. 6B can be a combination of substances such as phosphoric acid, hydrogen peroxide, and water.

The GaAs external base layer and the InGaP emitter layer are supported by columnar structure 11 (FIGS. 6B and 6C). The amounts of etching of the InGaP-made etching stop layer 3 and emitter layer 5 at this time are as negligibly small as 10 nm or less. Also, sectional observations indicate that the amount of side-etching of the GaAs layer 4 is within ±3% of a three-inch in-plane distribution 3σ.

Next, a 0.5-µm-thick $SiO_2$ film 17 is deposited using a plasma-excited chemical vapor deposition method. Sectional observations indicate that at this time, the each window with an opening can be completely filled with the $SiO_2$ film 17. Thus, the openings in each window are completely filled. FIG. 7A shows a top view of the major sections formed in this process step, and FIG. 7B shows a longitudinal sectional view of the major sections along lines 7A-7A and 7B-7B in FIG. 7A.

Finally, an emitter electrode 18 with a 0.2-µm AuGeNi film thickness is formed using a lift-off method. After this, in addition to 30 minutes of alloying at 350° C., photolithography and wet etching are conducted to separate elements and thus fabricate the C-up HBT. In the above wet-etching process step, hydrochloric acid is used for the InGaP-made etching stop layer 3, and a liquid mixture of phosphoric acid, hydrogen peroxide, and water, for the GaAs-made first emitter contact layer. FIG. 8A shows a top view of the major sections formed in this process step, and FIG. 8B shows a longitudinal sectional view of the major sections along lines 8B-8B and 8C-8C in FIG. 8A.

The emitter area in the strict sense in the present embodiment is the contact area between the base layer 6 and the emitter layer 5. However, since the film of the emitter layer 5 is thin (50 nm), electrons that have been injected from the emitter contact layer 4 and the emitter layer 5 into the base layer 6 hardly spreads in a lateral direction. Accordingly, these electrons instantly reach the base layer 6 through the emitter layer 5, so an effective emitter area becomes equal to the contact area between the layers 4 and 5. These facts were confirmed from emitter size dependence of an collector current A three-inch substrate in-plane variation in emitter-base voltage for a collector current of 1 μA is 3 mV, which is ⅓ or less of the value achievable in conventional structures. As can be seen from these facts, in the present embodiment, an effective emitter-base junction area is smaller than a base-collector junction area, and variations in emitter area due to over-etching of the second emitter contact layer 4 can be ignored. These provide the effect that the C-up HBT alone and an integrated circuit can be manufactured with high reproducibility. As described above, the film thickness of the emitter layer can be any value within a range of 15 nm or more, but up to 50 nm. Although the present embodiment uses InGaP to form the emitter layer, effects equivalent to those of the present embodiment can, of course, be obtained by conducting lattice alignment of the GaAs-containing substrate 1 made of, for example, AlGaAs, and using a material whose forbidden bandgap is greater than that of the GaAs material used for the base layer.

A reduction in base-emitter junction capacity was verifiable in the C-up HBT shown in the present embodiment. It was also verifiable that the C-up HBT shown in the present embodiment has small junction area dependence of "hfe". In addition, it was ascertainable that mechanical strength is ensured in the C-up HBT shown in the present embodiment.

These results indicate that the C-up HBT shown in the present embodiment is a C-up HBT that is small in collector-base junction capacity and in base-emitter junction capacity, has small junction area dependence of "hfe", and can achieve mechanical strength as well.

Second Embodiment

A second embodiment relates to a C-up HBT fabricated by forming an EB electrode after forming window structures, instead of forming an EB electrode before forming the window structures of the C-up HBT in the first embodiment. The present second embodiment will be described below using FIGS. 9 to 16C.

Figure 10A:
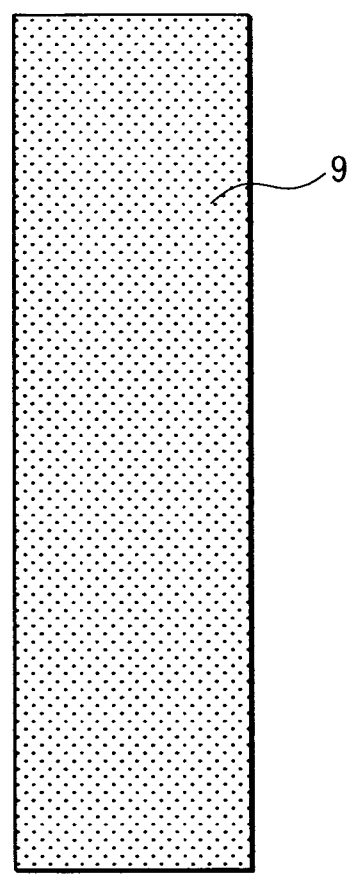
FIG. 10A is a top layout view of the masks used during the manufacturing process for the collector-up HBT of the second embodiment.

A layer structure similar/equivalent to that of the first embodiment is formed using metal-organic vapor phase epitaxy. The formation of the above layer structure is followed by depositing a WSi layer 9 (WSi: 0.3 in Si molar ratio, 0.5 μm in film thickness) on entire wafer surface using a high-frequency sputtering method (see FIG. 9). After that, dry etching with photolithography and $CF_4$ is used to process the WSi layer into a desired shape and thus form a collector electrode 9. FIG. 10A shows a mask layout view, and FIG. 10B shows a longitudinal sectional view of the device formed in this process phase.

Figure 10B:
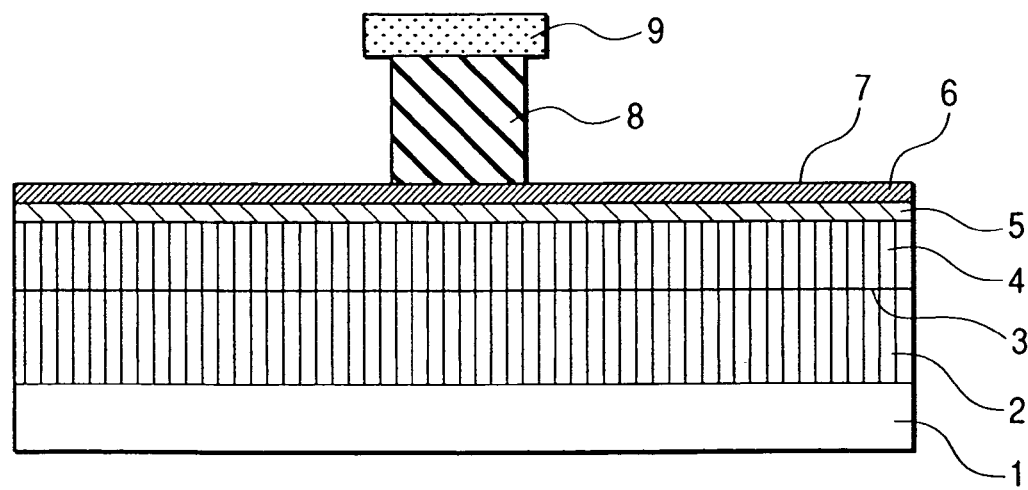
FIG. 10B is a sectional device view showing the collector-up HBT of the second embodiment in order of the manufacturing process steps.

Next, dry etching with $SF_6$ and $SiCl_4$ and wet etching with a liquid mixture of phosphoric acid, hydrogen peroxide, and water, are used in combination to remove a part of an n-type InGaAs collector layer 8 with the collector electrode 9 utilized as a masking region, and form the collector layer 8 into a desired shape (FIG. 10B).

The above is followed by depositing a 0.6-μm-thick $SiO_2$ film 10 using a plasma-excited chemical vapor deposition method. Next, the $SiO_2$ film 10 is processed into a desired shape by conducting an anisotropic etching operation with photolithography and a plasma mixture of $C_2F_6$ and $CHF_3$.

Figure 11A:
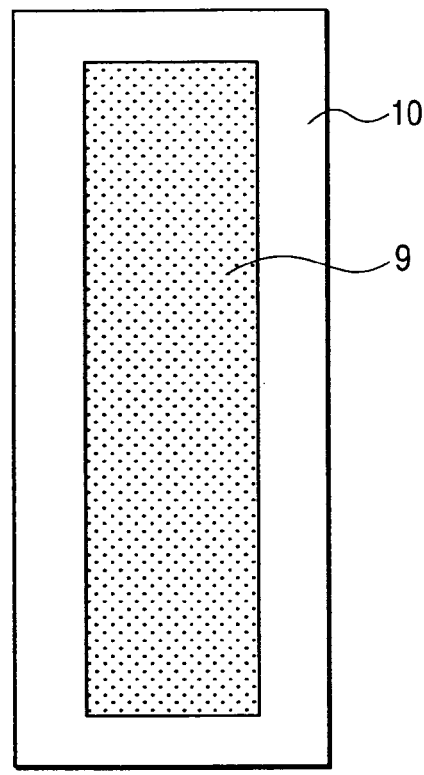
FIG. 11A is another top layout view of the masks used during the manufacturing process for the collector-up HBT of the second embodiment.
Figure 11B:
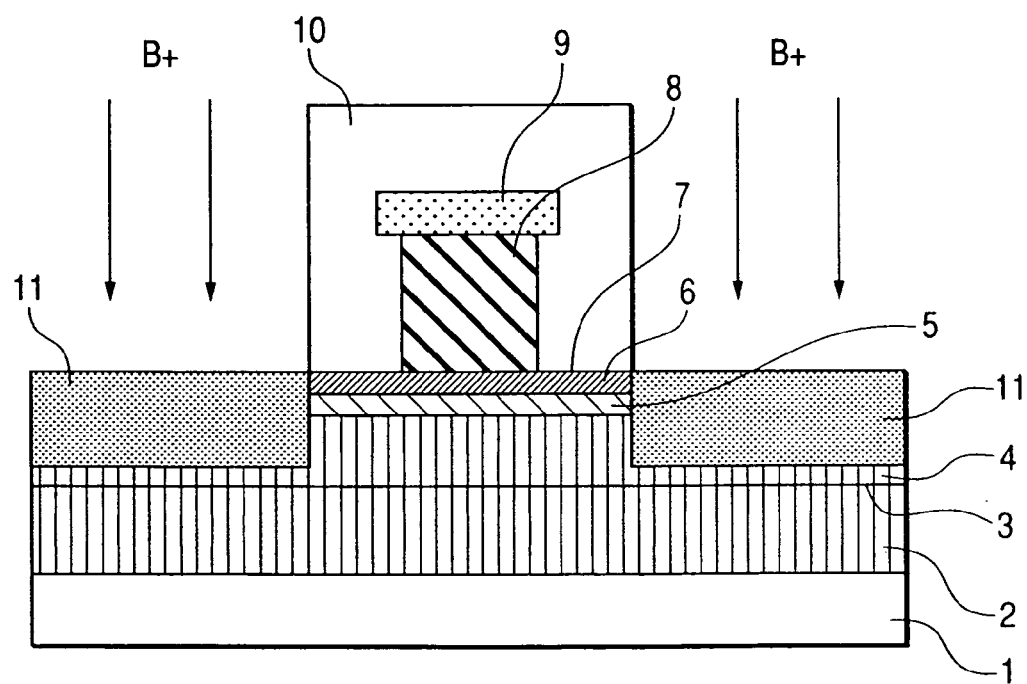
FIG. 11B is another sectional device view showing the collector-up HBT of the second embodiment in order of the manufacturing process steps.

After this, with the $SiO_2$ film as a masking region, boron ions are implanted at room temperature under the conditions of 50 keV in acceleration energy and $2\times10^{14} cm^{-2}$ in dose rate to thereby form a high-resistance GaAs region in an emitter contact layer formed under an external base region. This suppresses a portion of a base current which flows into a parasitic emitter-base junction. High-resistance GaAs region 11 can likewise be formed by implanting either hydrogen, helium, beryllium, carbon, nitrogen, oxygen, fluorine, or neon ions, instead of the boron ions. FIG. 11A shows a mask top view and the $SiO_2$ film, and FIG. 11B shows a longitudinal sectional view of the device formed in this process phase.

Figure 12A:
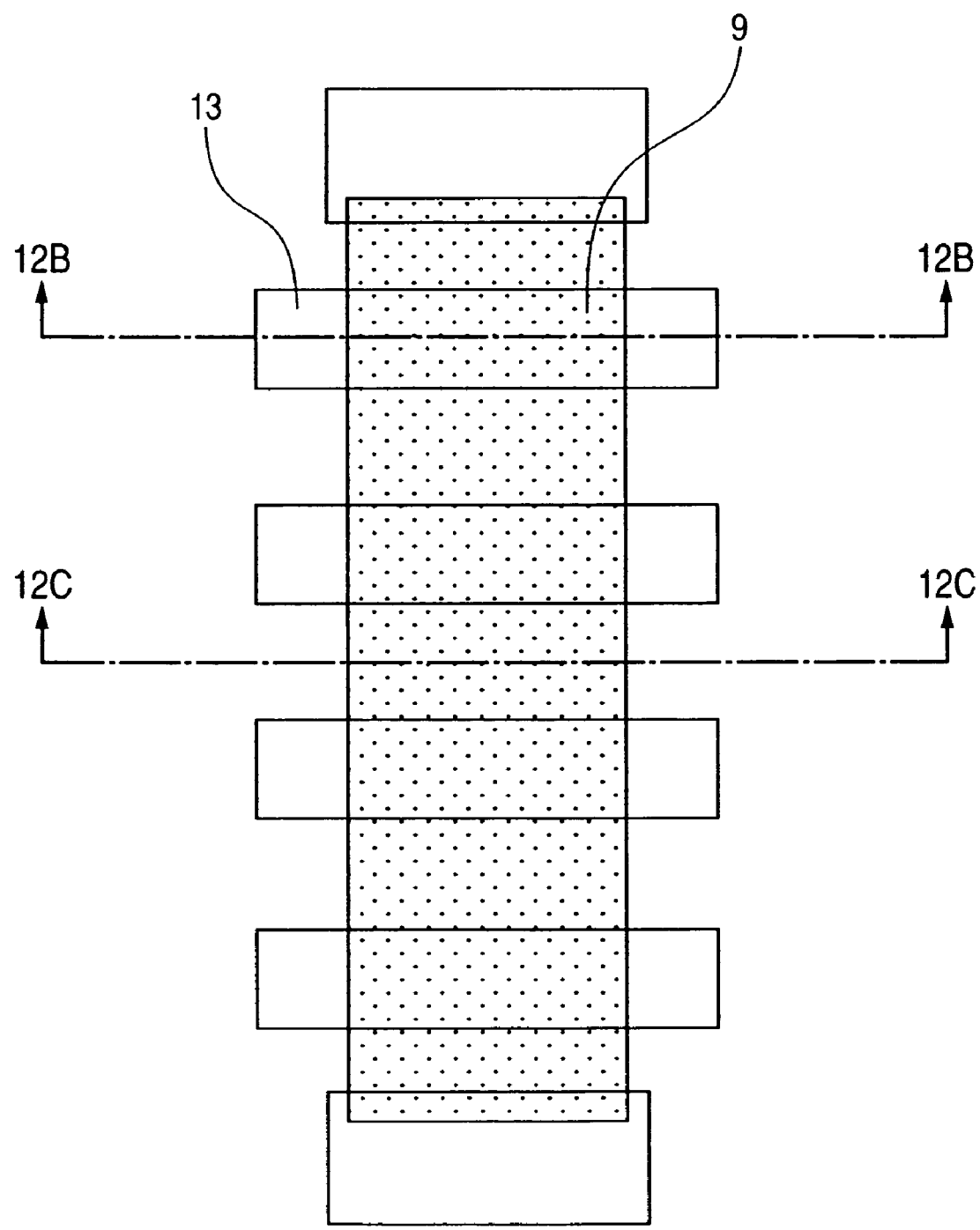
FIG. 12A is still another top layout view of the masks used during the manufacturing process for the collector-up HBT of the second embodiment.
Figure 12B:
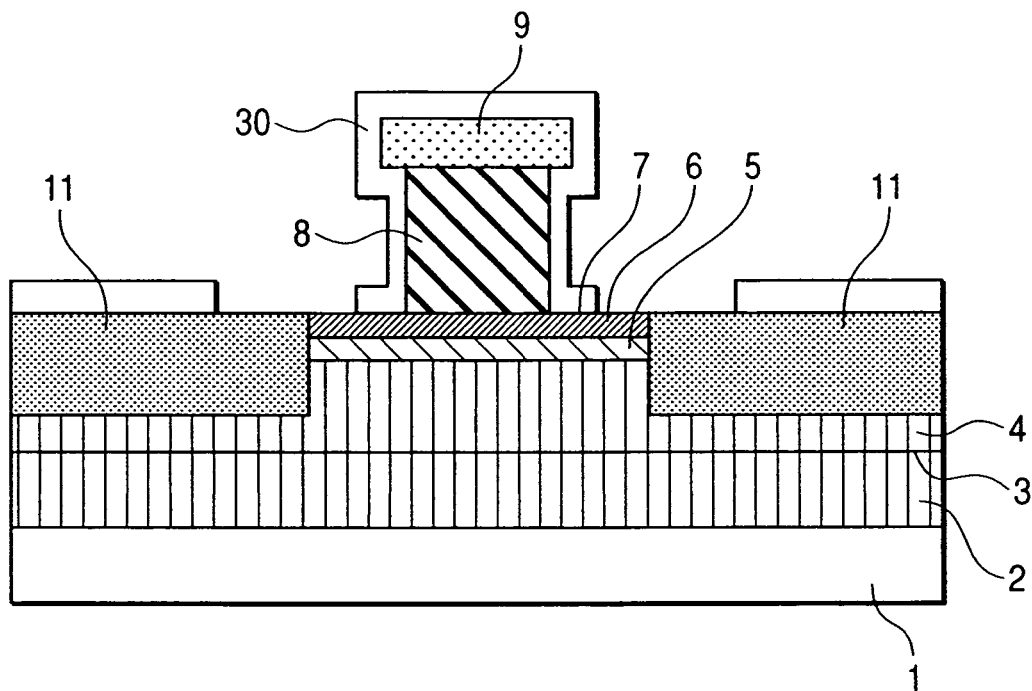
FIG. 12B is a sectional view of the collector-up HBT of the second embodiment, taken along lines 12B-12B in FIG. 12A.
Figure 12C:
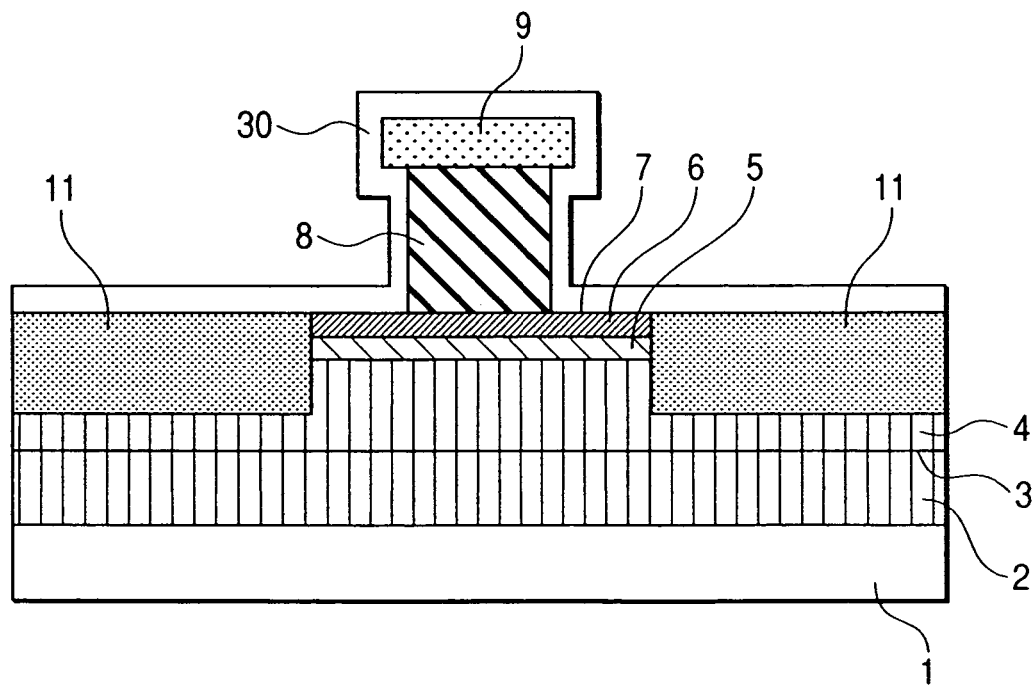
FIG. 12C is a sectional view of the collector-up HBT of the second embodiment, taken along lines 12C-12C in FIG. 12A.

After that, in order that multiple window sections 13 exist along collector layer periphery, formation in a self-aligned fashion is conducted by dry etching with photolithography and $CF_4$. FIG. 12A shows a top view of the major sections formed in this process step, and FIG. 12B is a longitudinal sectional view showing the device along lines 12B-12B and 12C-12C with respect to the mask in FIG. 12A.

Figure 13A:
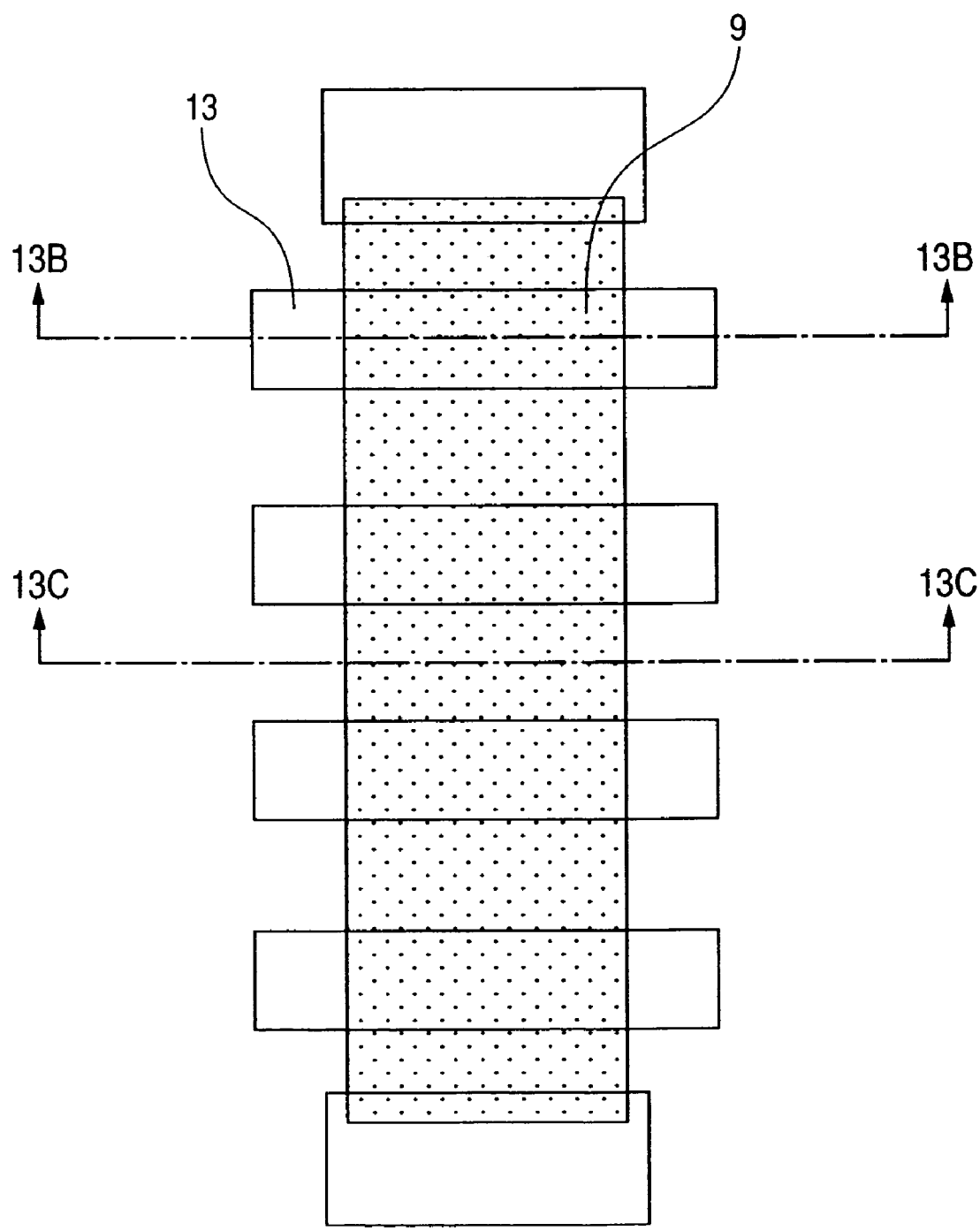
FIG. 13A is yet another top layout view of the masks used during the manufacturing process for the collector-up HBT of the second embodiment.
Figure 13B:
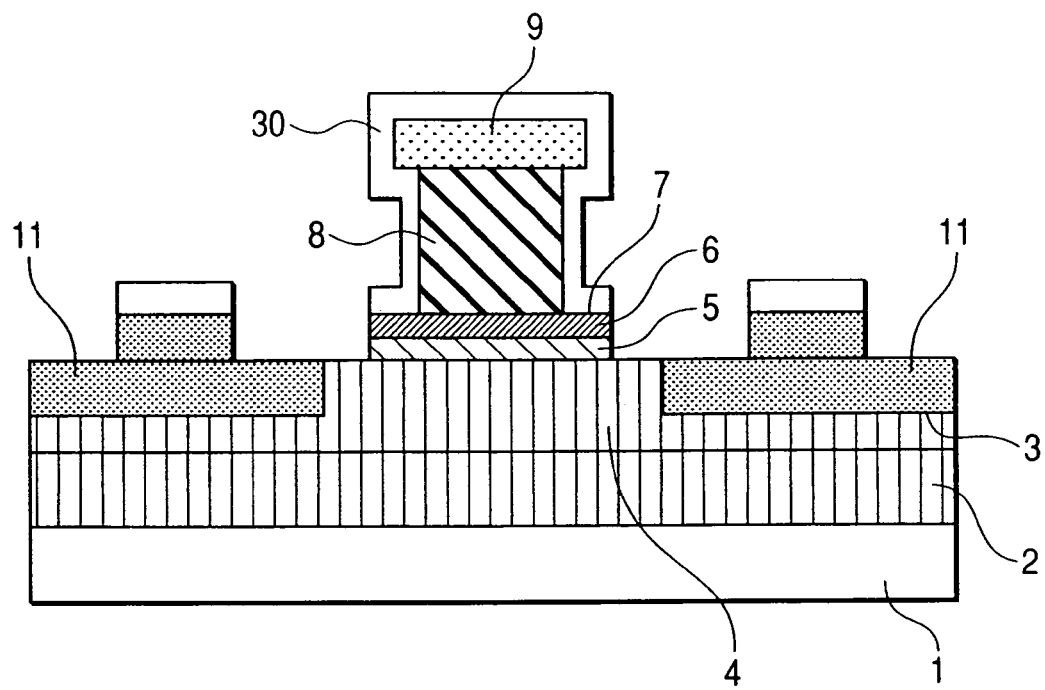
FIG. 13B is a sectional view of the collector-up HBT of the second embodiment, taken along lines 13B-13B in FIG. 13A.
Figure 13C:
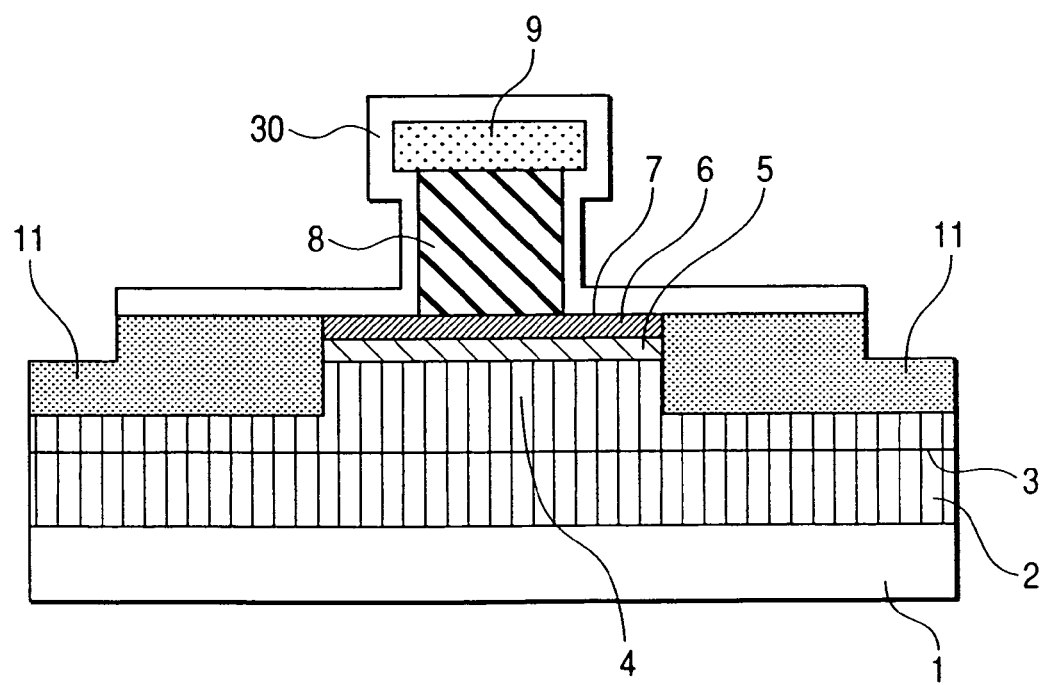
FIG. 13C is a sectional view of the collector-up HBT of the second embodiment, taken along lines 13C-13C in FIG. 13A.

Next, dry etching with $CF_4$ is conducted to vertically process portions of each of an InGaP-made etching stop layer 7, a GaAs-made base layer 6, an InGaP-made emitter layer 5, and a GaAs-made second emitter contact layer 4, to thereby form openings in the window sections. Also, the emitter contact layer is exposed from base exterior. FIG. 13A shows a top view of the major sections formed in this process step, and FIG. 13B is a longitudinal sectional view showing the device along lines 13B-13B and 13C-13C with respect to the mask in FIG. 13A.

Figure 14A:
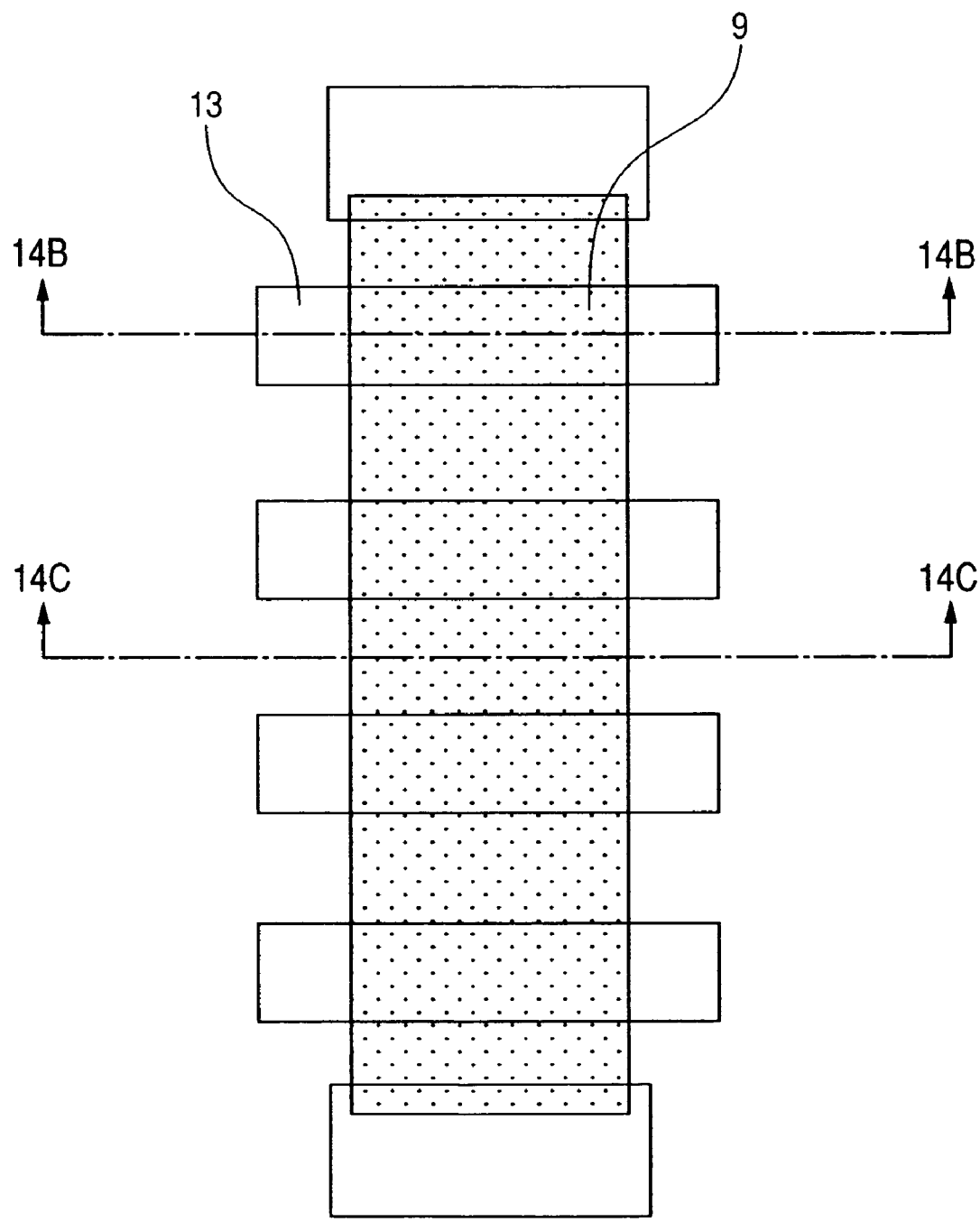
FIG. 14A is a further top layout view of the masks used during the manufacturing process for the collector-up HBT of the second embodiment.
Figure 14B:
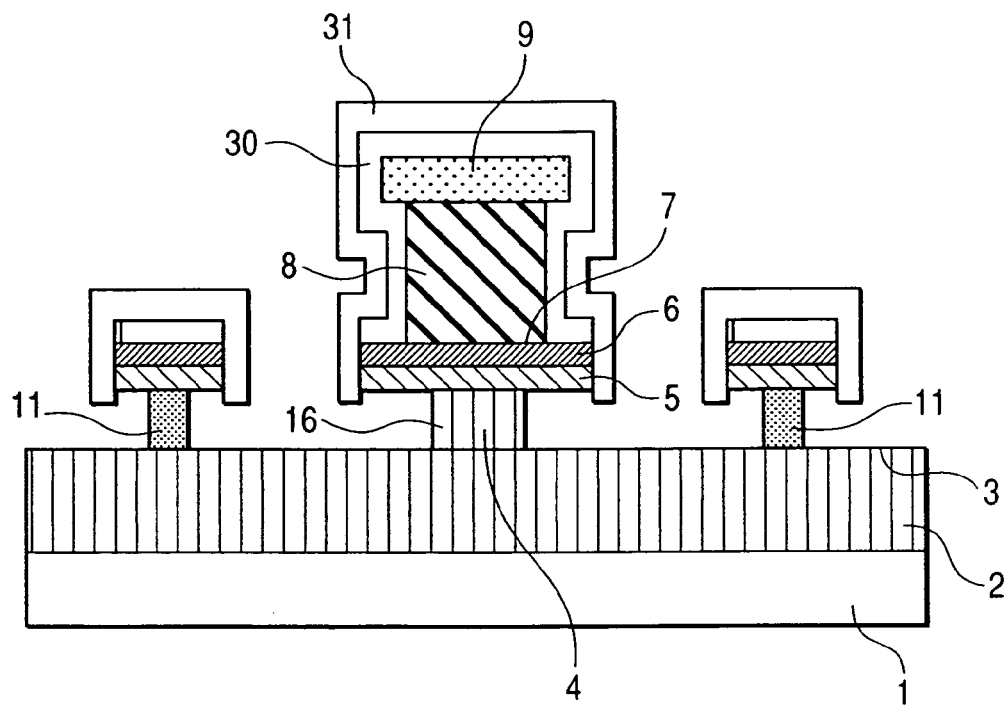
FIG. 14B is a sectional view of the collector-up HBT of the second embodiment, taken along lines 14B-14B in FIG. 14A.
Figure 14C:
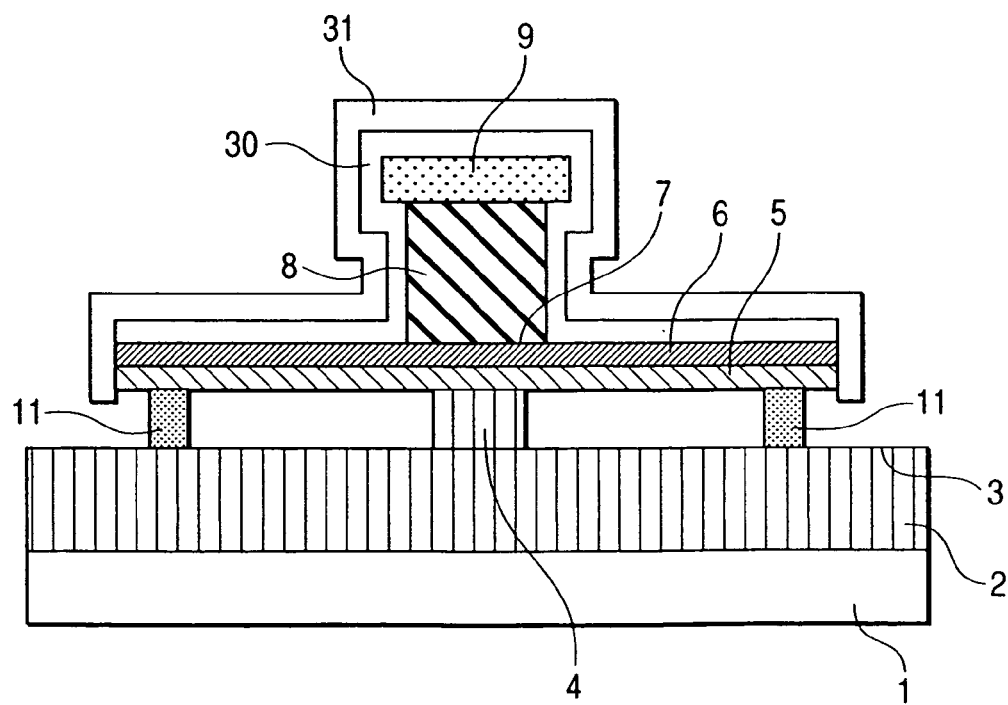
FIG. 14C is a sectional view of the collector-up HBT of the second embodiment, taken along lines 14C-14C in FIG. 14A.

Next, a 0.1-μm-thick $SiO_2$ film 15 is deposited using a plasma-excited chemical vapor deposition method, and then an anisotropic etching operation with photolithography and a plasma mixture of $C_2F_6$ and $CHF_3$ is conducted on $SiO_2$ film 15 to form an $SiO_2$ sidewall 16. Next, the second emitter contact layer made of highly doped n-type GaAs is side-etched by wet etching with a 5° C. liquid mixture of citric acid, hydrogen peroxide, and water, to thereby form a side face 31. FIG. 14A shows a top view of the major sections formed in this process step, and FIG. 14B is a longitudinal sectional view showing the device along lines 14B-14B and 14C-14C with respect to the mask in FIG. 14A. At this time, the emitter contact layer 4, positioned between the openings of the window sections, directly under the GaAs base layer 6 and the InGaP emitter layer 5, is wet-etched with a 5° C. liquid mixture of citric acid, hydrogen peroxide, and water, so as to become hollow (see FIGS. 14B, 14C). The GaAs external base layer and the InGaP emitter layer are supported by columnar structure 11 (see FIGS. 14B and 14C). The amounts of etching of InGaP-made etching stop layer 3 and emitter layer 5 at this time are as negligibly small as 10 nm or less. Also, sectional observations indicate that the amount of side-etching of the GaAs layer 4 is within ±3% of a three-inch in-plane distribution 3σ.

Next, a 0.5-μm-thick $SiO_2$ film 17 is deposited using a plasma-excited chemical vapor deposition method. Sectional observations indicate that at this time, each window with an opening can be completely filled with the $SiO_2$ film 17. Thus, the openings in each window are completely filled.

Figure 15A:
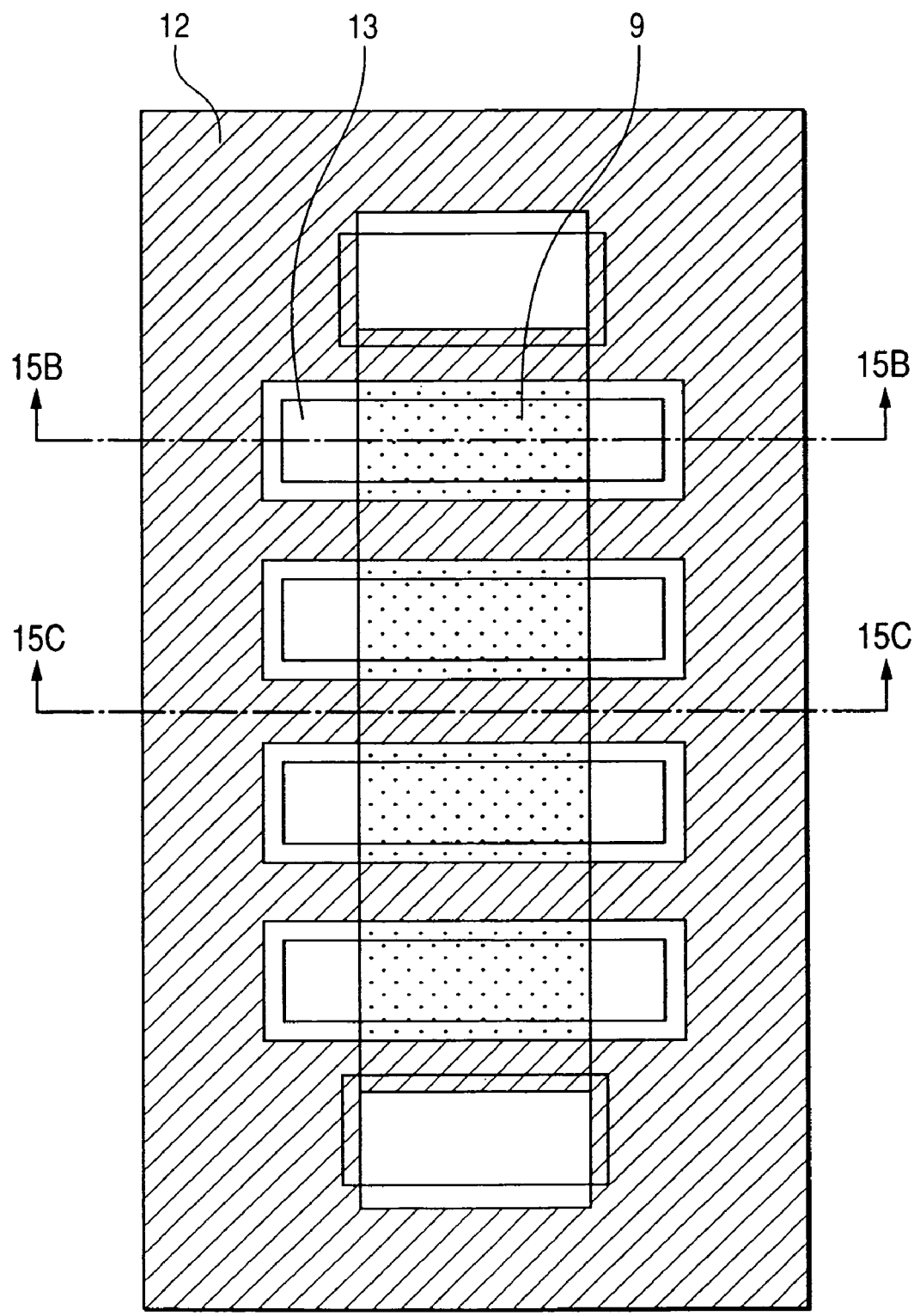
FIG. 15A is a further top layout view of the masks used during the manufacturing process for the collector-up HBT of the second embodiment.
Figure 15B:
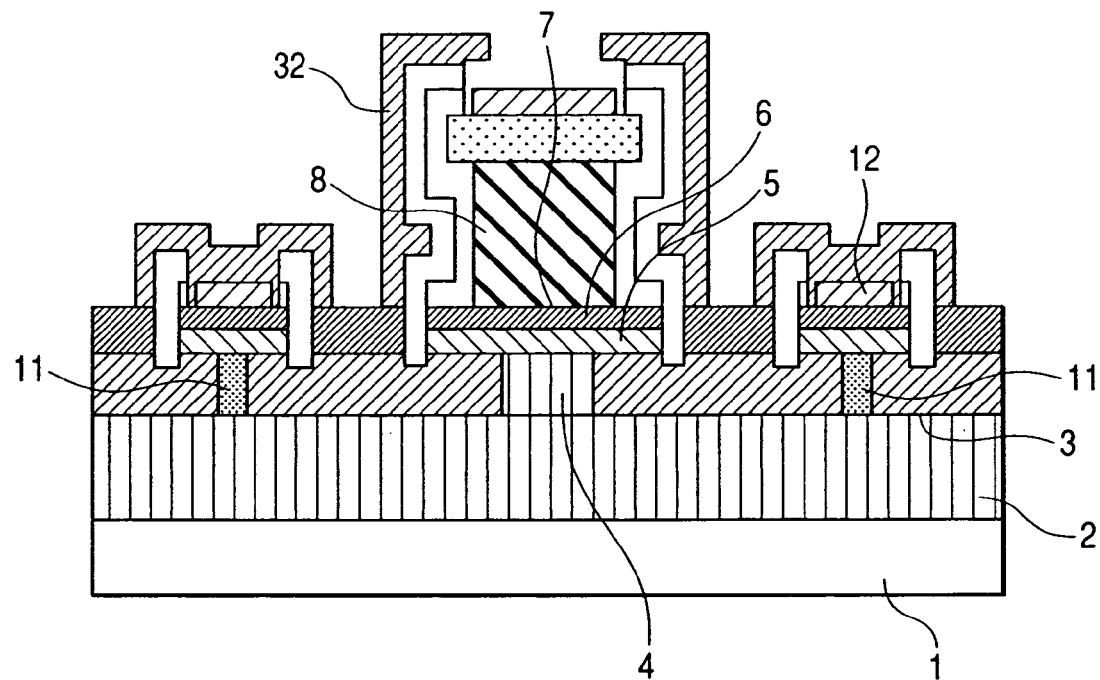
FIG. 15B is a sectional view of the collector-up HBT of the second embodiment, taken along lines 15B-15B in FIG. 15A.
Figure 15C:
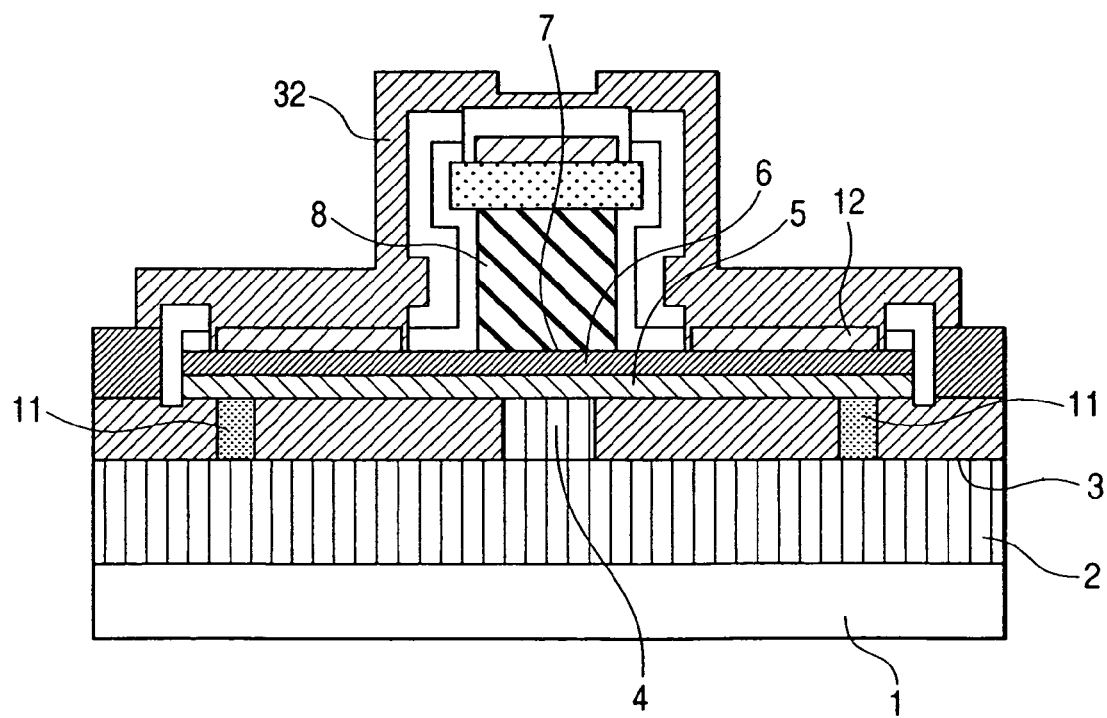
FIG. 15C is a sectional view of the collector-up HBT of the second embodiment, taken along lines 15C-15C in FIG. 15A.

Next, a base electrode 12 that is a stacked structure formed up of a 20-nm-thick Pt film, a 50-nm-thick Ti film, a 50-nm-thick Pt film, and a 200-nm-thick Au film, is formed in a self-aligned fashion, although only for a partial region between window sections, by using an electron beam evaporation method and a lift-off method. FIG. 15A shows a top view of the major sections formed in this process step, and FIG. 15B is a longitudinal sectional view showing the device along lines 15B-15B and 15C-15C with respect to the mask in FIG. 15A.

Figure 16A:
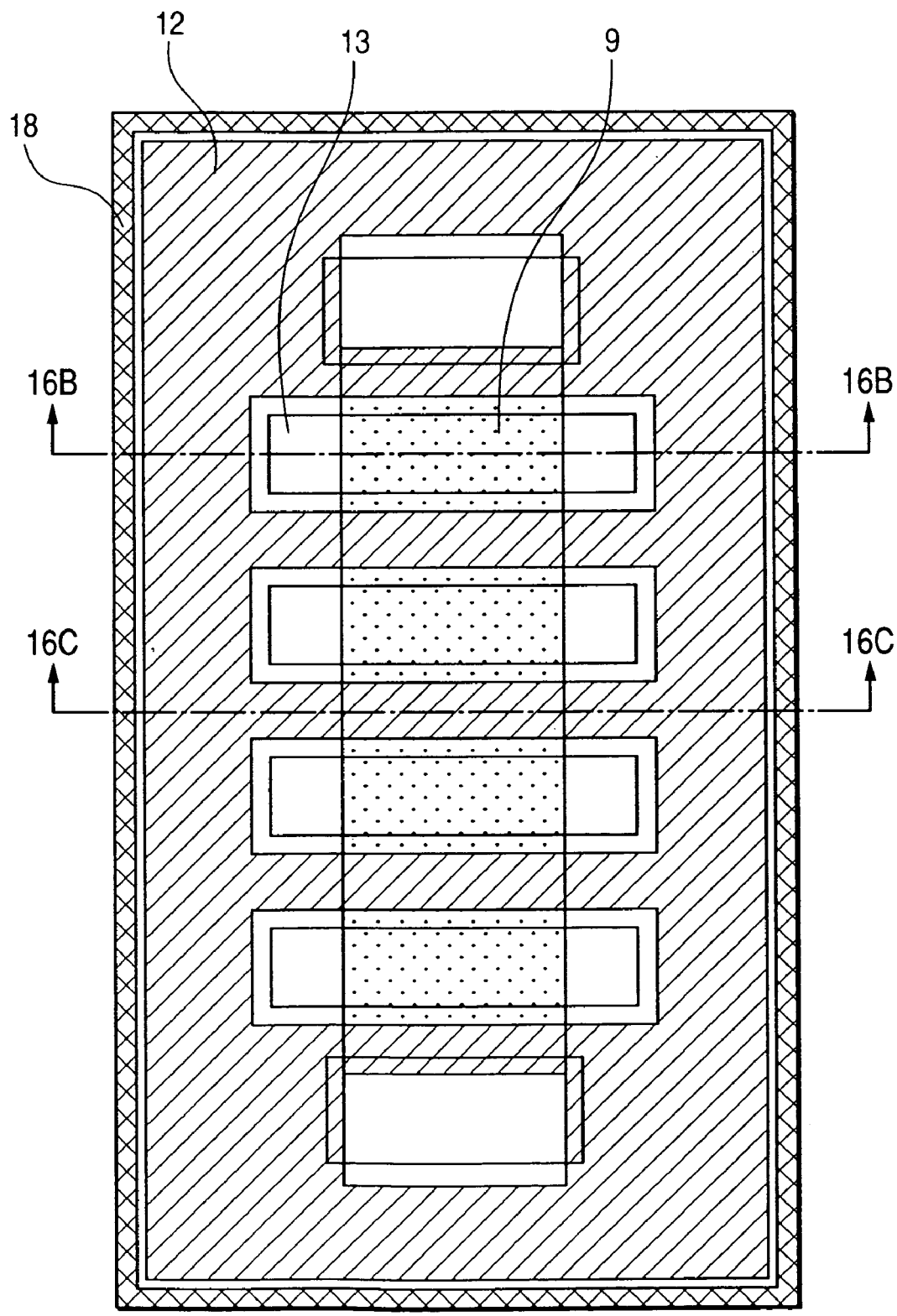
FIG. 16A is a top layout view of the masks used during a manufacturing process for a collector-up HBT of a second embodiment.
Figure 16B:
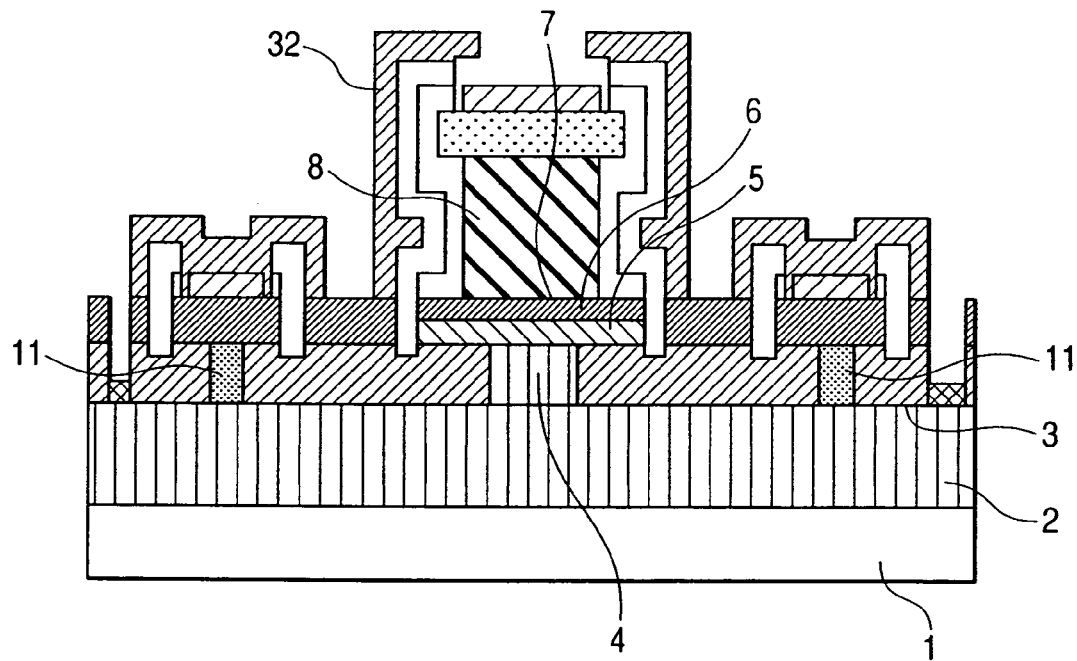
FIG. 16B is a sectional view of the collector-up HBT of the second embodiment, taken along lines 16B-16B in FIG. 16A.
Figure 16C:
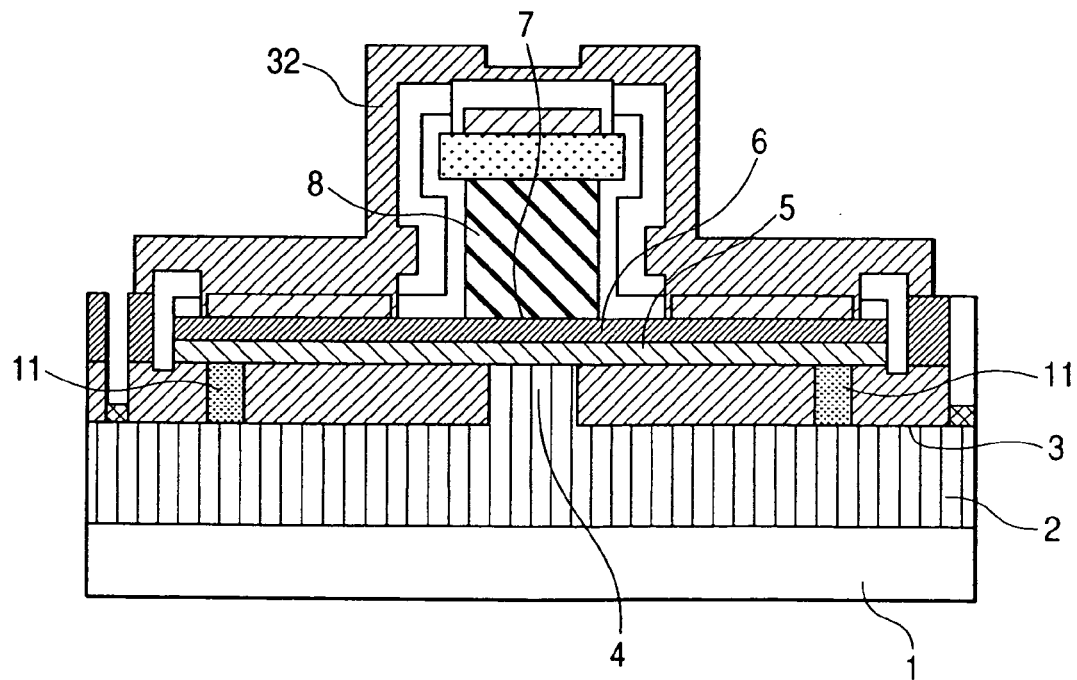
FIG. 16C is a sectional view of the collector-up HBT of the second embodiment, taken along lines 16C-16C in FIG. 16A.

Finally, an emitter electrode 18 with a 0.2 μm AuGeNi film thickness is formed using a lift-off method. After this, in addition to 30 minutes of alloying at 350° C., photolithography and wet etching are conducted to separate elements and thus fabricate the C-up HBT. In the above wet-etching process step, hydrochloric acid is used for the InGaP-made etching stop layer 3, and a liquid mixture of phosphoric acid, hydrogen peroxide, and water, for GaAs-made first emitter contact layer. FIG. 16A shows a top view of the major sections formed in this process step, and FIG. 16B shows a longitudinal sectional view of the device along lines 16B-16B and 16C-16C with respect to the mask in FIG. 16A.

Third Embodiment

A third embodiment relates to an npn-type C-up HBT created by making changes as follows to the materials used in the first embodiment:

(1) A semi-dielectric InP (100) substrate is used instead of the semi-dielectric GaAs (100) substrate 1.

(2) An emitter contact layer made of highly doped InAlGaAs and having a 0.53 InAs molar ratio, a $5 \times 10^{18} cm^{-3}$ Si concentration, and a 0.5 μm film thickness, is formed instead of the first emitter contact layer 2 made of highly doped n-type GaAs.

(3) An etching stop layer made of highly doped InAlGaAs and having a 0.5 InAs molar ratio, AlAs and GaAs molar ratios that are arbitrarily variable in progressive form, a $5 \times 10^{17} cm^{-3}$ Si concentration, and a 0.1 μm film thickness, is formed instead of the etching stop layer 3 made of highly doped n-type InGaP.

(4) An emitter contact layer made of highly doped InGaAs and having a 0.5 InAs molar ratio, a $5 \times 10^{18} cm^{-3}$ Si concentration, and a 0.5 μm film thickness, is formed instead of the second emitter contact layer 4 made of highly doped n-type GaAs.

(5) An n-type InAlAs layer having a 0.5 InAs molar ratio, a $3 \times 10^{17} cm^{-3}$ Si concentration, and a 0.05 μm film thickness, is formed instead of the emitter layer 5 made of n-type InGaP.

(6) A highly doped p-type InGaAs layer having a 0.53 InAs molar ratio, a $5 \times 10^{19} cm^{-3}$ C-concentration, and a 0.05 μm film thickness, is formed instead of the base layer 6 made of highly doped p-type GaAs.

(7) An etching stop layer made of n-type InAlGaAs and having a 0.5 InAs molar ratio, AlAs and GaAs molar ratios that are arbitrarily variable in progressive form, and a $5 \times 10^{17} cm^{-3}$ Si concentration, is formed instead of the etching stop layer 7 made of n-type InGaP.

(8) A collector layer made of n-type InGaAs and having a 0.5 InAs molar ratio, an Si concentration that changes from $3 \times 10^{16} cm^{-3}$ to $2 \times 10^{19} cm^{-3}$, and a 0.8 μm film thickness, is formed instead of the collector layer 8 made of n-type InGaAs.

Collector electrode 9, base electrode 10, and emitter electrode 18 are each a stacked structure with 200-nm-thick Au, 50-nm-thick Pt, and 50-nm-thick Ti. Other details of the fabrication method are the same as in the first embodiment.

In addition to having exactly the same advantageous effects as those of the first embodiment, the third embodiment has a feature in that since its semiconductor layer does not contain P of a high steam pressure, it is possible to use the molecular beam epitaxy of a totally solid raw material that uses low-toxicity solid arsenic (As), not gas source molecular beam epitaxy.

Fourth Embodiment

Figure 17A:
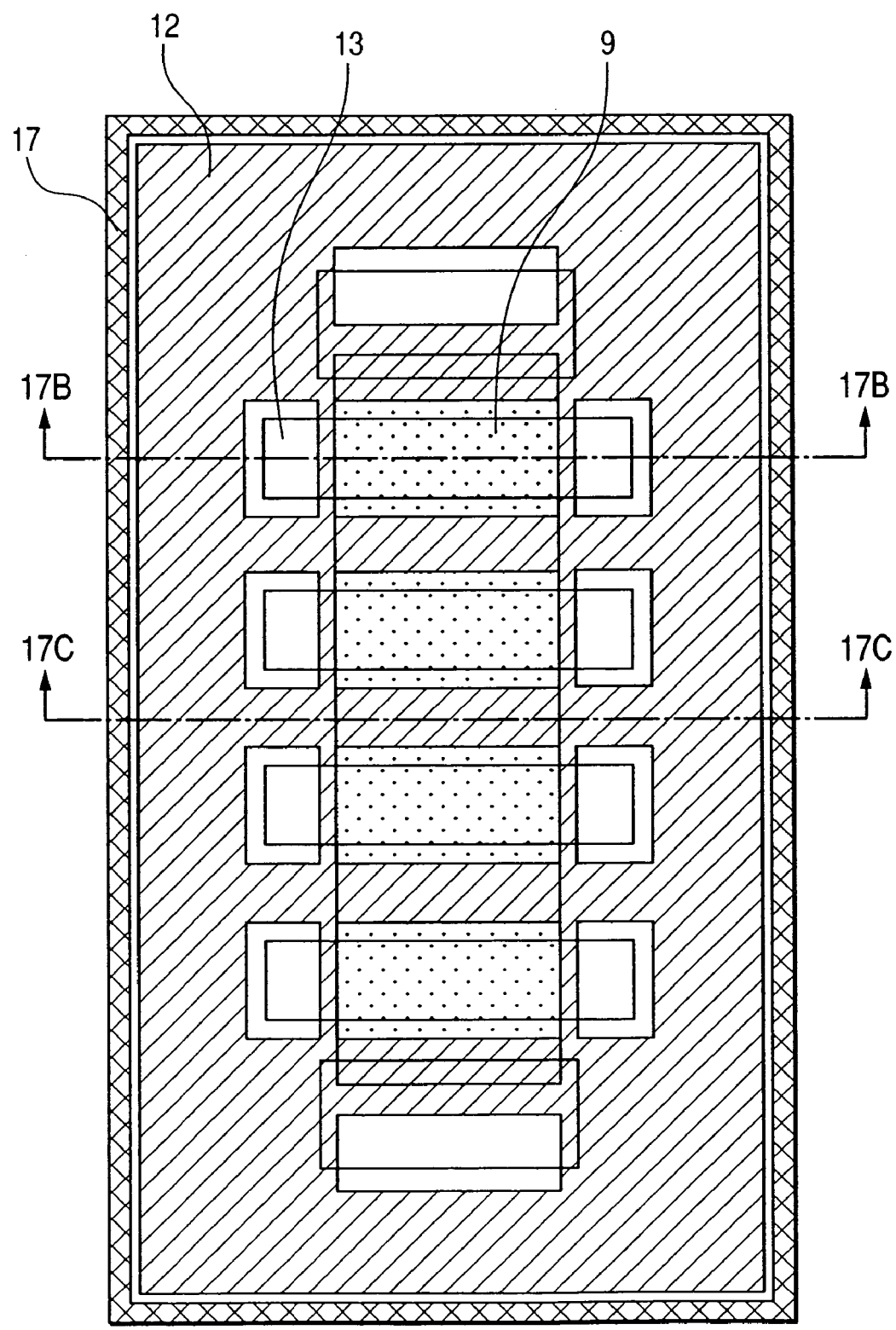
FIG. 17A is a top layout view of the masks used during a manufacturing process for a collector-up HBT of a fourth embodiment.
Figure 17B:
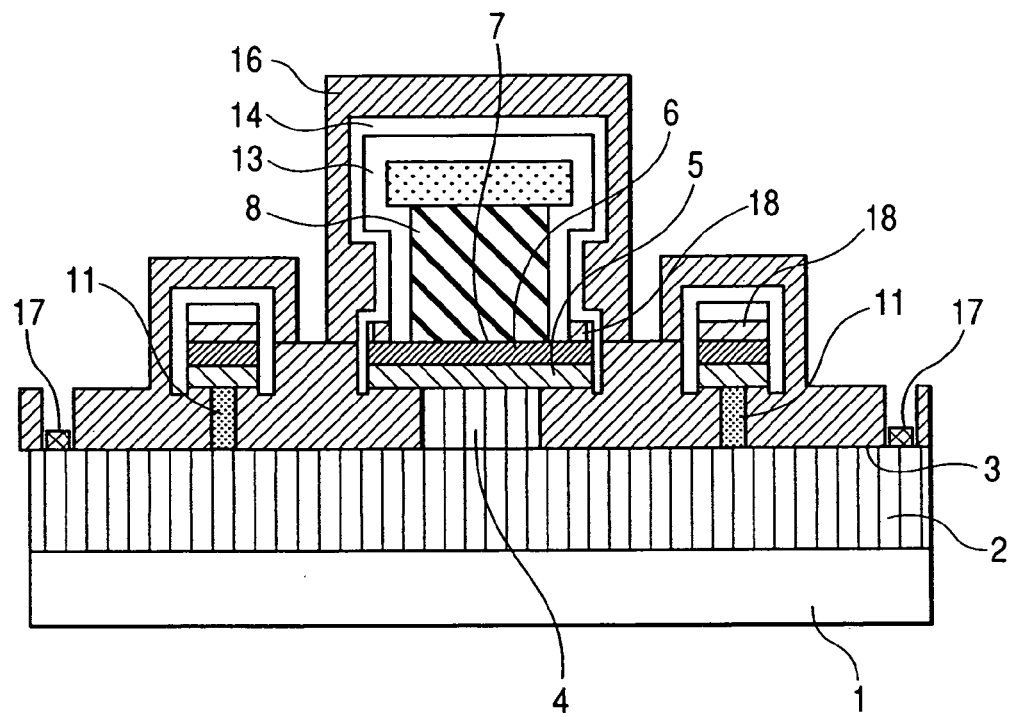
FIG. 17B is a sectional view of the collector-up HBT of the fourth embodiment, taken along lines 17B-17B in FIG. 17A.
Figure 17C:
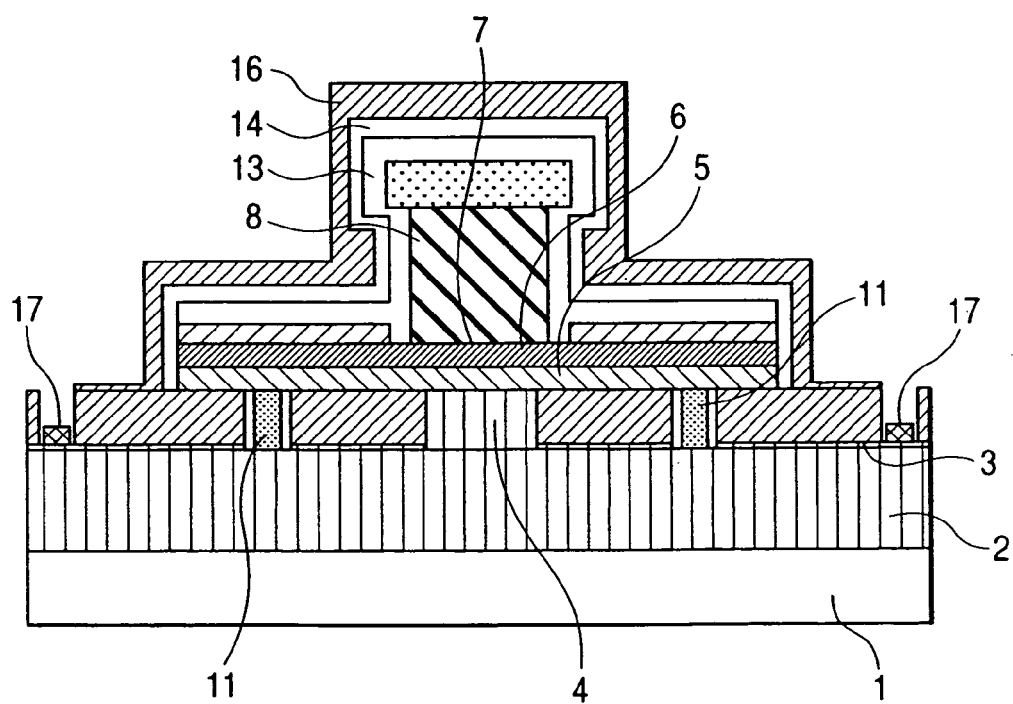
FIG. 17C is a sectional view of the collector-up HBT of the fourth embodiment, taken along lines 17C-17C in FIG. 17A.

Instead of the base electrode 12 in the first embodiment of a C-up HBT, a base electrode 18 is formed in a self-aligned fashion over an entire peripheral section of a collector layer (see FIG. 17B). Other details of an associated device fabrication method are the same as in the first embodiment. FIG. 17A shows a top view of the major sections formed in this process step, and FIG. 17B shows a longitudinal sectional view of the device along lines 17B-17B and 17C-17C with respect to the mask shown in FIG. 17A.

The present fourth embodiment has exactly the same advantageous effects as those of the first embodiment. In addition, while a base resistance value for a collector size of 4.5×30 μm in the C-up HBT of the first embodiment is 87Ω, base resistance in the fourth embodiment is controlled to 50Ω or less.

Fifth Embodiment

Figure 18A:
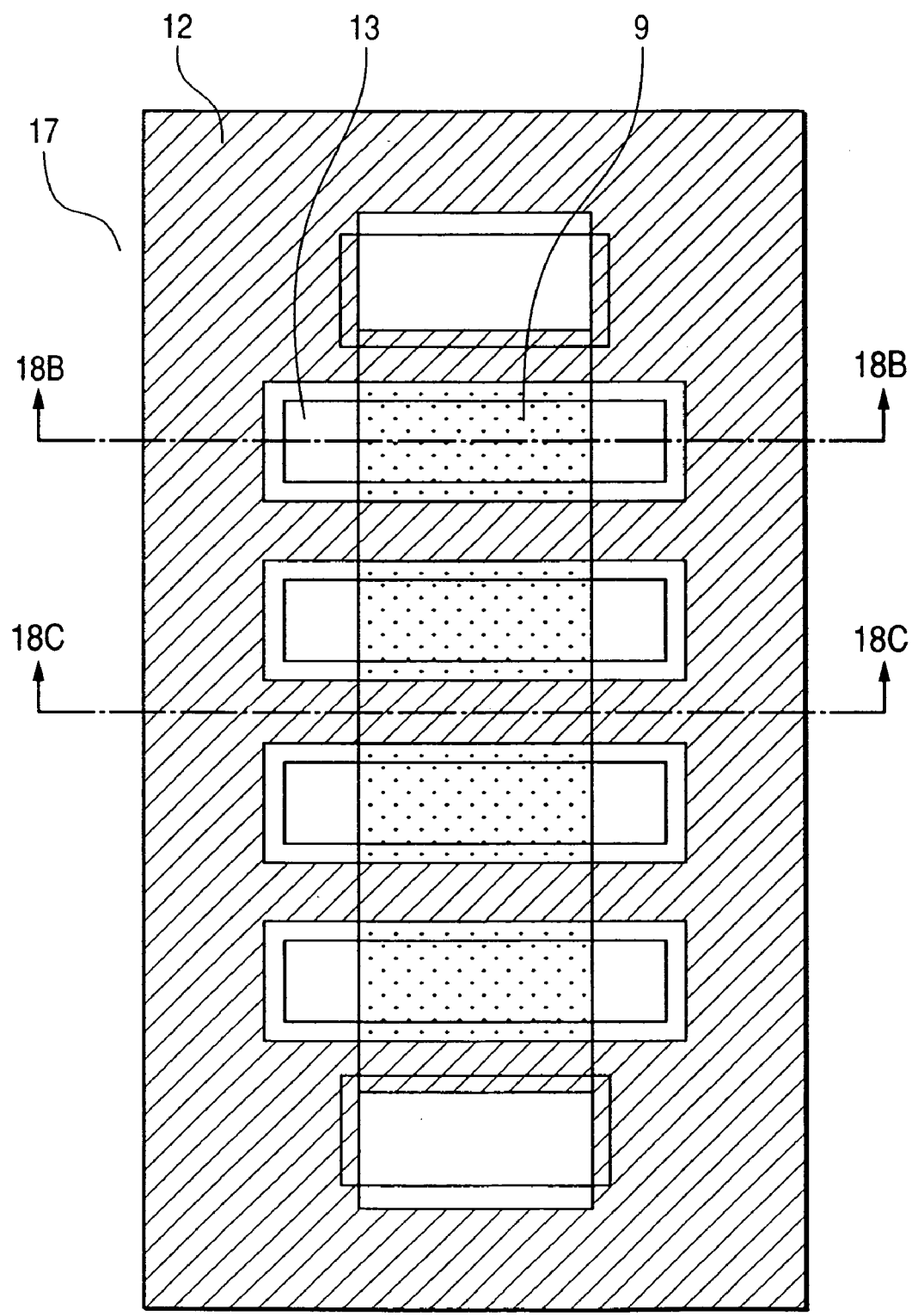
FIG. 18A is a top layout view of the masks used during a manufacturing process for a collector-up HBT of a fifth embodiment.
Figure 18B:
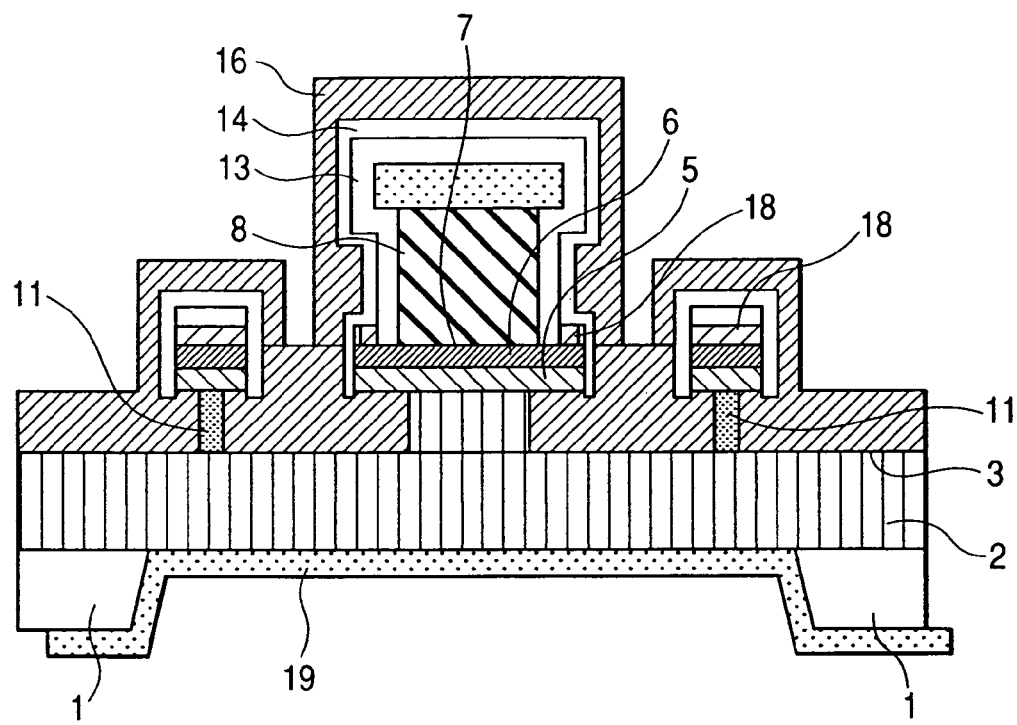
FIG. 18B is a sectional view of the collector-up HBT of the fifth embodiment, taken along lines 18B-18B in FIG. 18A.
Figure 18C:
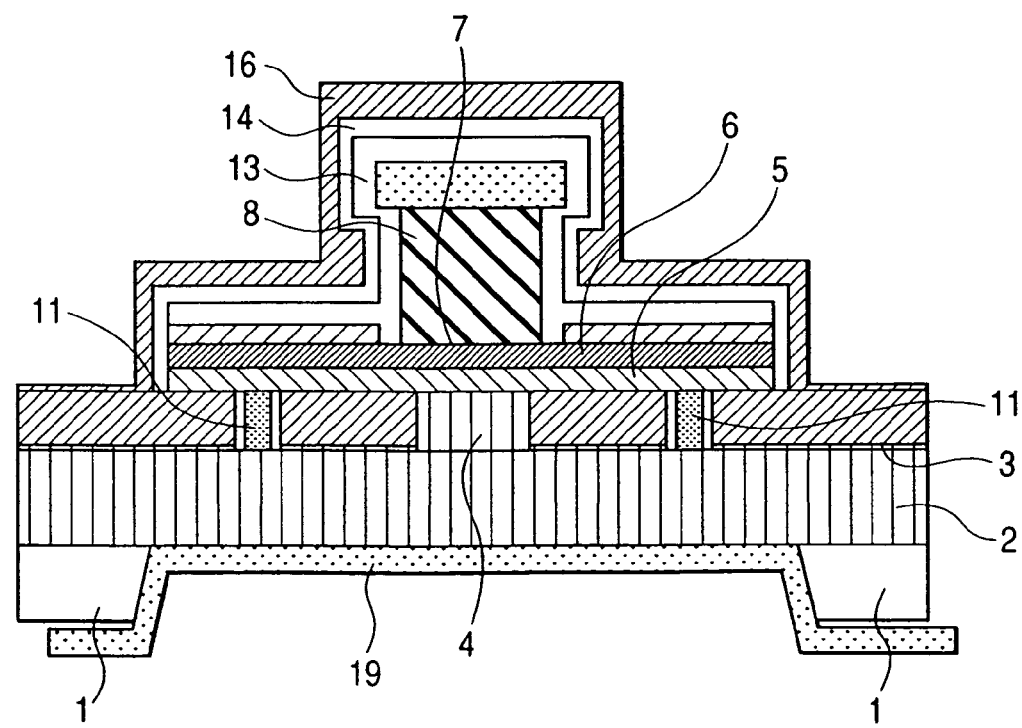
FIG. 18C is a sectional view of the collector-up HBT of the fifth embodiment, taken along lines 18C-18C in FIG. 18A.

An emitter electrode 19 is formed from reverse side, instead of an emitter electrode 17 being formed from the surface in the first embodiment of a C-up HBT. FIG. 18A shows a top view of the major sections formed in this process step, and FIG. 18B shows a longitudinal sectional view of an associated device along lines 18B-18B and 18C-18C with respect to the mask shown in FIG. 18A.

In addition to having exactly the same advantageous effects as those of the first embodiment, the fifth embodiment has a feature in that since an emitter electrode formed from the surface is absence, circuits can be miniaturized when integrated.

The fifth embodiment has another feature in that since the emitter electrode on the reverse side has a construction with heat release holes directly under a transistor, thermal resistance can be reduced as a result.

Sixth Embodiment

A sixth embodiment relates to an E-up HBT. In the present embodiment, an npn-type E-up HBT is created by making changes as follows to the materials used in the first embodiment. On a semi-dielectric GaAs (100) substrate 1, the E-up HBT is constructed using the following materials:

(1) A first collector contact layer made of highly doped n-type GaAs and having a $5 \times 10^{18} cm^{-3}$ Si concentration and a 0.5 μm film thickness, is formed instead of the highly doped n-type GaAs emitter contact layer 2.

(2) A second collector contact layer made of highly doped n-type GaAs and having a $5 \times 10^{18} cm^{-3}$ Si concentration and a 0.5 μm film thickness, is formed instead of the highly doped n-type InGaP-made etching stop layer 3 and the highly doped n-type GaAs emitter contact layer 4.

(3) An etching stop layer made of n-type InGaP and having a 0.5 InP molar ratio, a $5 \times 10^{17} cm^{-3}$ Si concentration, and a 0.05 μm film thickness, is formed instead of the n-type InGaP emitter layer 5.

(4) A highly doped p-type GaAs base layer 6 is formed with a $5 \times 10^{19} cm^{-3}$ C-concentration, and a 0.05 μm film thickness.

(5) An n-type InGaP emitter layer with a $3 \times 10^{17} cm^{-3}$ Si concentration and a 0.03 μm film thickness is formed instead of the n-type InGaP-made etching stop layer 7.

(6) An n-type InGaAs emitter layer with a 0.5 InAs molar ratio, an Si concentration that changes from $3 \times 10^{16} \mathrm{cm}^{-3}$ to $2 \times 10^{19} \mathrm{cm}^{-3}$, and a 0.4 μm film thickness, is formed instead of the n-type InGaAs collector layer 8.

Figure 19A:
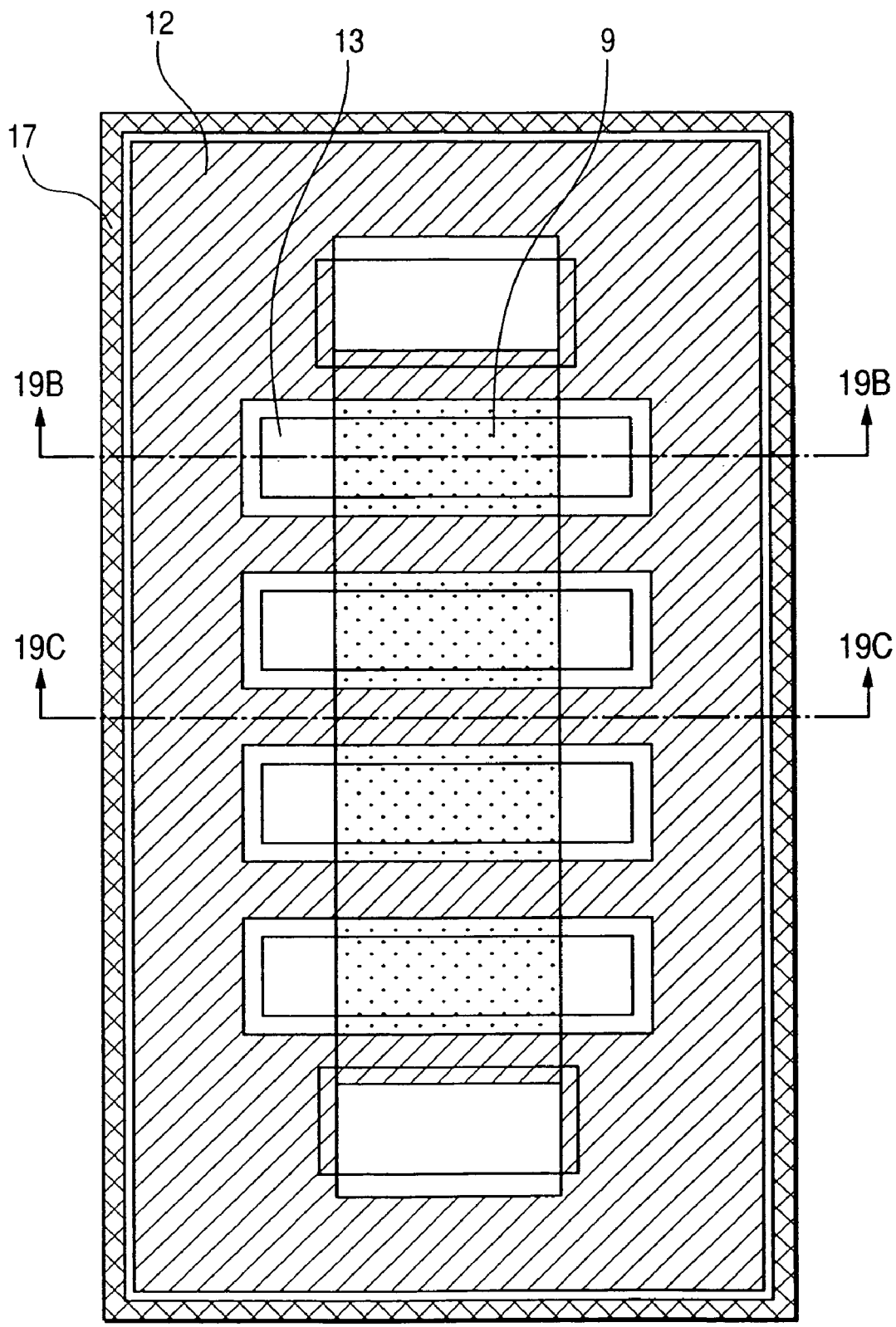
FIG. 19A is a top layout view of the masks used during a manufacturing process for a collector-up HBT of a sixth embodiment.
Figure 19B:
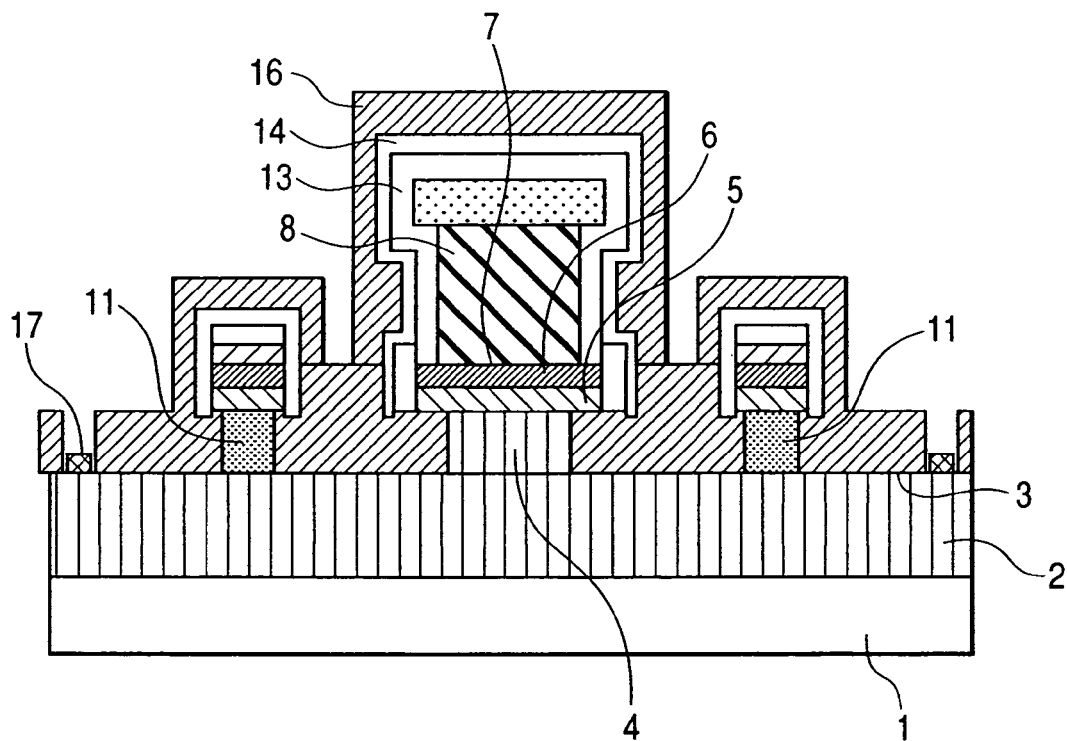
FIG. 19B is a sectional view of the collector-up HBT of the sixth embodiment, taken along lines 19B-19B in FIG. 19A.
Figure 19C:
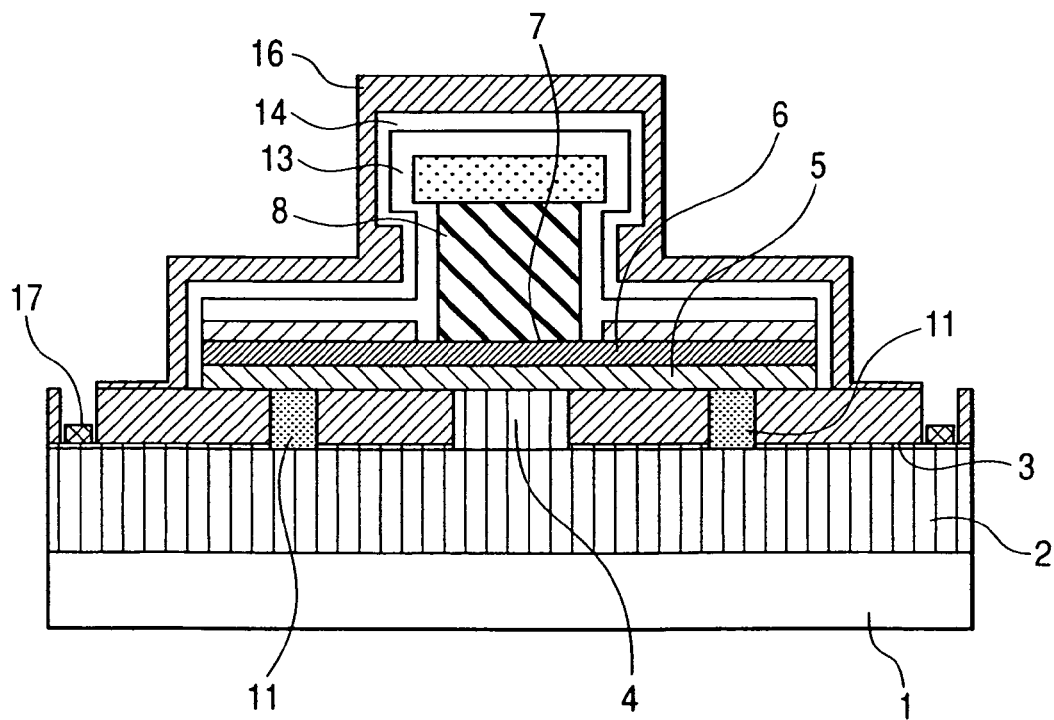
FIG. 19C is a sectional view of the collector-up HBT of the sixth embodiment, taken along lines 19C-19C in FIG. 19A.

Metal-organic vapor phase epitaxy is used to form each layer. Other details of an associated device fabrication method are the same as in the first embodiment. However, the E-up HBT needs to be created so that after etching from a window section, a base-collector junction area does not exceed an emitter-base junction area. FIG. 19A shows a top view of the major sections formed in this process step, and FIG. 19B shows a longitudinal sectional view of the device along lines 19B-19B and 19C-19C with respect to the mask shown in FIG. 19A.

In addition to having exactly the same advantageous effects as those of the first embodiment, the sixth embodiment has the feature that it can implement the reduction of base-collector junction capacity that has been deemed to be difficult in E-up HBTs based on conventional technology.

The present invention covers a wide range of characteristics. Some of its main embodiments are itemized below.

(1) A first embodiment is a semiconductor device with a collector-up heterojunction bipolar transistor, including: a semiconductor substrate; an emitter contact layer made of an n-type semiconductor formed on the substrate; an emitter layer made of another n-type semiconductor formed on the emitter contact layer; a base layer made of a p-type semiconductor formed on the emitter layer, the p-type semiconductor having a forbidden bandgap smaller than that of the semiconductor forming the collector layer; a collector layer made of still another semiconductor formed on the base layer; a collector contact layer made of yet another n-type semiconductor formed on the collector layer; and an emitter electrode, a base electrode, and a collector electrode, the three electrodes being connected to the emitter contact layer, the base layer, and the collector contact layer, respectively.

This semiconductor device further has a plurality of window structures on the base layer formed around the collector layer, wherein: the base layer, the emitter layer, or the emitter contact layer does not exist in the window structures; between the window structures, only the base layer exists and the emitter layer or the emitter contact layer does not exist; at an external base layer positioned externally to the window structures, the base layer, the emitter layer, and the emitter contact layer all exist in order for the external base layer to have a columnar structure; and a base-emitter junction area is smaller than a collector-base junction area.

(2) A second embodiment is the semiconductor device according to above item (1), wherein: the window structures are each filled with a dielectric material; and a region directly under the base layer positioned between the window structures is filled with another dielectric material.

(3) A third embodiment is the semiconductor device according to above item (2), wherein, in the foregoing semiconductor structure: the emitter layer has a film thickness equal to or greater than 15 nm, but up to 50 nm; a plurality of window structures are formed on the base layer positioned around the collector layer; the base layer and/or the emitter contact layer does not exist in the window structures; between the window structures, only the base layer and the emitter layer exist and the emitter contact layer does not exist; at an external base layer positioned externally to the window structures, the base layer, the emitter layer, and the emitter contact layer all exist in order for the external base layer to have a columnar structure; and a base-emitter junction area is smaller than a collector-base junction area.

(4) A fourth embodiment is the semiconductor device according to above item (3), wherein: the emitter contact layer has a side face of a {111} plane; and an area of the side face of the {111} plane, disposed at the opposite side of the emitter layer, is greater than an area of a face disposed at the emitter layer side.

(5) A fifth embodiment is the semiconductor device according to above item (4), wherein: the emitter contact layer is made of GaAs; and the emitter layer is made of InGaP or AlGaAs.

(6) A sixth embodiment is the semiconductor device according to above item (5), wherein: in the foregoing semiconductor structure, the emitter electrode is formed from a reverse side.

(7) A seventh embodiment is a semiconductor device with an emitter-up heterojunction bipolar transistor, including: the foregoing semiconductor substrate; a collector contact layer made of an n-type semiconductor formed on the substrate; a collector layer made of another n-type semiconductor formed on the collector contact layer; a base layer formed on the collector layer and made of a p-type semiconductor; an emitter layer formed on the base layer and made of still another n-type semiconductor having a forbidden bandgap greater than that of the semiconductor forming the base layer; an emitter contact layer formed on the emitter layer and made of yet another n-type semiconductor; and a collector electrode, a base electrode, and an emitter electrode, the three electrodes being connected to the collector contact layer, the base layer, and the emitter contact layer, respectively.

This semiconductor device further has a plurality of window structures on the base layer formed around the emitter layer, wherein: the base layer, the collector layer, or the collector contact layer does not exist in the window structures; between the window structures, only the base layer exists and the collector layer or the collector contact layer does not exist; and at an external base layer positioned externally to the window structures, the base layer, the collector layer, and the collector contact layer all exist in order for the external base layer to have a columnar structure.

(8) An eighth embodiment is the semiconductor device according to above item (7), wherein: the collector contact layer is made of GaAs; and the emitter layer is made of InGaP or AlGaAs.

(9) A transistor of the present invention is very suitable for constructing a power amplifier. It suffices just for the power amplifier itself to be of general circuit composition. Of course, it is free to construct a power amplifier that uses multiple such transistors.

Next, embodiments relating to the manufacturing method applied for per this Specification are itemized below.

(10) A tenth embodiment is a method of manufacturing a semiconductor device, the method including the process steps of, on a semi-dielectric substrate: forming at least an emitter contact semiconductor layer, an emitter semiconductor layer, a base semiconductor layer, a collector semiconductor layer, and a collector contact semiconductor layer, in that order, in a stacked form; forming a collector electrode of a desired shape on an upper portion of the collector contact semiconductor layer; processing the collector semiconductor layer into a mesa shape to form a collector region; processing the base semiconductor layer into a mesa shape to form a base region; forming in the base region a base electrode having the foregoing window structures; etching an emitter layer or an emitter contact layer from the window structures, to thereby form a hollow region directly under a base layer which is positioned between the window structures; processing the emitter semiconductor layer into a mesa shape to form an emitter region; and forming an emitter electrode in the emitter region.

(11) A method of manufacturing a semiconductor device, the method including the process steps of, on a semi-dielectric substrate: forming at least an emitter contact semiconductor layer, an emitter semiconductor layer, a base semiconductor layer, a collector semiconductor layer, and a collector contact semiconductor layer, in that order, in a stacked form; forming a collector electrode of a desired shape on an upper portion of the collector contact semiconductor layer; processing the collector semiconductor layer into a mesa shape to form a collector region; processing the base semiconductor layer into a mesa shape to form a base region; forming in the base region an opening in each of the foregoing window structures; etching an emitter layer or an emitter contact layer from the window structures, to thereby form a hollow region directly under a base layer which is positioned between the window structures; forming a base electrode in a region excepting the window structures in the base region; processing the emitter semiconductor layer into a mesa shape to form an emitter region; and forming an emitter electrode in the emitter region.

(12) A twelfth embodiment is the semiconductor device manufacturing method according to above item (11), wherein the method further includes the process step of forming the emitter electrode from a reverse face of the foregoing semiconductor substrate.

(13) A thirteenth embodiment is a method of manufacturing a semiconductor device, the method including the process steps of, on a semi-dielectric substrate: forming at least a collector contact semiconductor layer, a collector semiconductor layer, a base semiconductor layer, an emitter semiconductor layer, and an emitter contact semiconductor layer, in that order, in a stacked form; forming an emitter electrode of a desired shape on an upper portion of the emitter contact semiconductor layer; processing the emitter semiconductor layer into a mesa shape to form an emitter region; processing the base semiconductor layer into a mesa shape to form a base region; forming in the base region a base electrode having the foregoing window structures; etching a collector layer or a collector contact layer from the window structures, to thereby form a hollow region directly under a base layer which is positioned between the window structures; and processing the collector semiconductor layer into a mesa shape to form a collector region.

(14) A fourteenth embodiment is a method of manufacturing a semiconductor device, the method including the process steps of, on a semi-dielectric substrate: forming at least a collector contact semiconductor layer, a collector semiconductor layer, a base semiconductor layer, an emitter semiconductor layer, and an emitter contact semiconductor layer, in that order, in a stacked form; forming an emitter electrode of a desired shape on an upper portion of the emitter contact semiconductor layer; processing the emitter semiconductor layer into a mesa shape to form an emitter region; processing the base semiconductor layer into a mesa shape to form a base region; forming in the base region an opening in each of the foregoing window structures; etching a collector layer or a collector contact layer from the window structures, to thereby form a hollow region directly under a base layer which is positioned between the window structures; forming a base electrode in a region excepting the window structures in the base region; processing the collector semiconductor layer into a mesa shape to form a collector region; and forming a collector electrode in the collector region.

The meanings of the reference numbers used in this Specification are as follows:

1 . . . Semiconductor substrate
2 . . . First emitter contact layer
3 . . . Etching stop layer
4 . . . Second emitter contact layer
5 . . . Emitter layer
6 . . . Base layer
7 . . . Etching stop layer
8 . . . Collector layer
9 . . . Collector electrode layer
10 . . . Isolation layer
11 . . . High-resistance region
12 . . . Base electrode
13 . . . Window structure region
14 . . . Isolation layer
15 . . . Isolation layer
16 . . . Side-etched sidewall
17 . . . Isolation layer for filling the window structure region
18 . . . Emitter electrode
19 . . . Reverse-side emitter electrode
20 . . . Side-etched region
30 . . . Isolation layer
31 . . . Isolation layer
32 . . . Isolation layer for filling the window structure region

What is claimed is:

1. A semiconductor device with a heterojunction bipolar transistor, comprising:
    a semiconductor substrate;
    an emitter contact layer made of an n-type semiconductor formed on the semiconductor substrate;
    an emitter layer made of another n-type semiconductor formed on the emitter contact layer;
    a base layer made of a p-type semiconductor formed on the emitter layer, the p-type semiconductor having a forbidden bandgap smaller than a forbidden bandgap of the semiconductor material forming the emitter layer;
    a collector layer made of still another n-type semiconductor formed on the base layer, the collector layer being narrower than the base layer in a direction parallel to a major face of the semiconductor substrate;
    a collector contact layer made of yet another n-type semiconductor formed on the collector layer; and
    an emitter electrode, a base electrode, and a collector electrode, the three electrodes being connected to the emitter contact layer, the base layer, and the collector contact layer, respectively;
    wherein:
    the base layer has a plurality of removal portions thereof in a region associated with a peripheral portion of the collector layer;

in a stacked semiconductor structural section associated with the removal portions of the base layer, the base layer or the emitter layer or the emitter contact layer does not exist or neither of the latter two layers exists;

between, of the plural removal portions of the base layer, adjacent first and second removal portions thereof, the base layer exists and the emitter layer or the emitter contact layer does not exist or neither of the latter two layers exists;

at an external base layer associated with a position external to the removal portions of the base layer, the base layer, the emitter layer, and the emitter contact layer exist in order for the external base layer to have a columnar structure; and a base-emitter junction area is smaller than a collector-base junction area.

2. The semiconductor device according to claim 1, wherein at least a part of the removal portions of the base layer is filled with a dielectric material, and wherein a region directly under the base layer positioned between, of the plural removal portions of the base layer, adjacent first and second removal portions thereof, is filled with another dielectric material.

3. The semiconductor device according to claim 2, wherein the emitter layer has a film thickness equal to or greater than 15 nm, but up to 50 nm.

4. The semiconductor device according to claim 2, wherein:

the emitter layer has a film thickness equal to or greater than 15 nm, but up to 50 nm;

a peripheral section of the collector layer has in the base layer a plurality of removal portions of the base layer;

in a stacked semiconductor structural section associated with the removal portions of the base layer, neither the base layer nor the emitter layer exists;

between, of the plural removal portions of the base layer, adjacent first and second removal portions thereof, the base layer exists and the emitter layer does not exist;

at an external base layer associated with a position external to the removal portions of the base layer, the base layer, the emitter layer, and the emitter contact layer exist in order for the external base layer to have a columnar structure.

5. The semiconductor device according to claim 4, wherein: the emitter contact layer is made of GaAs, and the emitter layer is made of InGaP or AlGaAs.

6. The semiconductor device according to claim 1, wherein the emitter electrode is led out onto a reverse face of the semiconductor substrate.

7. The semiconductor device according to claim 5, wherein the emitter electrode is led out onto a reverse face of the semiconductor substrate.

8. A semiconductor device with a heterojunction bipolar transistor, comprising:

a semiconductor substrate;

a first conductive type first semiconductor layer formed on the semiconductor substrate;

a first conductive type second semiconductor layer of a desired shape, formed on the first conductive type first semiconductor layer;

a second conductive type third semiconductor layer formed on the first conductive type second semiconductor layer, the second conductive type third semiconductor layer having a forbidden bandgap smaller than a forbidden bandgap of the first conductive type second semiconductor layer and forming a base region;

a first conductive type fourth semiconductor layer formed on the second conductive type third semiconductor layer, the first conductive type fourth semiconductor layer having a forbidden bandgap larger than the forbidden bandgap of the second conductive type third semiconductor layer;

a first conductive type fifth semiconductor layer formed on the first conductive type fourth semiconductor layer;

a first electrode, a second electrode, and a third electrode, the three electrodes being connected to the first conductive type first semiconductor layer, the second conductive type third semiconductor layer, and the first conductive type fifth semiconductor layer, respectively;

wherein:

a peripheral section of the first conductive type fourth semiconductor layer has, in the second conductive type third semiconductor layer, a plurality of removal portions of the second conductive type third semiconductor layer;

in a stacked semiconductor structural section associated with the removal portions of the second conductive type third semiconductor layer, the second conductive type third semiconductor layer or the first conductive type second semiconductor layer or the first conductive type first semiconductor layer does not exist or neither of the latter two semiconductor layers exists;

between, of the plural removal portions of the second conductive type third semiconductor layer, first and second removal portions thereof that are adjacent to each other, the second conductive type third semiconductor layer exists, and the first conductive type fourth semiconductor layer or the first conductive type fifth semiconductor layer does not exist or neither of the latter two semiconductor layers exists; and in the region of the second conductive type third semiconductor layer that is associated with a position external to the removal portions of the second conductive type third semiconductor layer, the second conductive type third semiconductor layer, the first conductive type second semiconductor layer, and the first conductive type first semiconductor layer exist in order for the associated region to have a columnar structure.

9. The semiconductor device according to claim 8, wherein: the first semiconductor layer is constructed as an emitter contact layer, the second semiconductor layer as an emitter layer, the third semiconductor layer as a base layer, the four semiconductor layer as a collector layer, and the fifth semiconductor layer as a collector contact layer.

10. The semiconductor device according to claim 8, wherein: the first semiconductor layer is constructed as a collector contact layer, the second semiconductor layer as a collector layer, the third semiconductor layer as a base layer, the four semiconductor layer as an emitter layer, and the fifth semiconductor layer as an emitter contact layer.

11. A power amplifier having the semiconductor device of claim 8 in a plurality of places.

12. A power amplifier having the semiconductor device of claim 9 in a plurality of places.

* * * * *